US012625201B2

(12) United States Patent
Toutov et al.

(10) Patent No.: US 12,625,201 B2
(45) Date of Patent: May 12, 2026

(54) CONTROLLING MOTION WITH MAGNETOMETERS

(71) Applicant: Astra Navigation, Inc., Escondido, CA (US)

(72) Inventors: Alexandre Toutov, Inverary (CA); Pavlo Borsuk, Kyiv (UA)

(73) Assignee: Astra Navigation, Inc., The Woodlands, TX (US)

( * ) Notice: Subject to any disclaimer, the term of this patent is extended or adjusted under 35 U.S.C. 154(b) by 154 days.

(21) Appl. No.: 17/743,353

(22) Filed: May 12, 2022

(65) Prior Publication Data

US 2024/0069123 A1     Feb. 29, 2024

(51) Int. Cl.
*G01R 33/10*     (2006.01)
*G01R 33/02*     (2006.01)
*G05D 1/00*     (2024.01)

(52) U.S. Cl.
CPC ......... *G01R 33/0206* (2013.01); *G01R 33/10* (2013.01); *G05D 1/0259* (2013.01)

(58) Field of Classification Search
CPC .. G01R 33/0206; G01R 33/10; G01R 33/072; G01R 33/091; G05D 1/0259; G01C 21/1654; G01C 21/08; G01V 3/165; G01V 3/16
USPC ......................................................... 324/227
See application file for complete search history.

(56) References Cited

U.S. PATENT DOCUMENTS

| | | | |
|---|---|---|---|
| 6,476,610 B1* | 11/2002 | Wiegert | B63G 7/06 |
| | | | 324/225 |
| 8,521,339 B2 | 8/2013 | Gariepy et al. | |
| 9,518,821 B2 | 12/2016 | Malay | |
| 9,857,179 B2 | 1/2018 | Larsen et al. | |
| 11,029,352 B2 | 6/2021 | Blanc-Paques et al. | |
| 2005/0099177 A1* | 5/2005 | Greelish | G01R 33/025 |
| | | | 324/252 |
| 2005/0160609 A1* | 7/2005 | Kwon | G01C 17/38 |
| | | | 33/356 |

(Continued)

FOREIGN PATENT DOCUMENTS

| | | |
|---|---|---|
| CN | 101867868 | 10/2010 |
| CN | 111707179 A | 9/2020 |

(Continued)

OTHER PUBLICATIONS

Search Report and Written Opinion from PCT Application No. PCT/IB2023/057130 dated Oct. 18, 2023.

(Continued)

*Primary Examiner* — Arleen M Vazquez
*Assistant Examiner* — Robert P Alejnikov, Jr.

(57) ABSTRACT

In one embodiment, an apparatus includes a first magnetometer that measures a magnetic induction and direction of a magnetic field. The first magnetometer has a first coordinate frame that includes a first x axis, a first y axis, and a first z axis. The apparatus includes a second magnetometer that measures the magnetic induction and direction of the magnetic field. The second magnetometer has a second coordinate frame that includes a second x axis, a second y axis, and a second z axis. Each of one or more of the second x axis, the second y axis, or the second z axis is has a predetermined orientation relative to the first x axis, the first y axis, or the first z axis.

29 Claims, 26 Drawing Sheets

(56) References Cited

U.S. PATENT DOCUMENTS

| | | | |
|---|---|---|---|
| 2008/0125920 A1 | 5/2008 | Miles et al. | |
| 2009/0088974 A1 | 4/2009 | Yasan et al. | |
| 2009/0150457 A1 | 6/2009 | Nakamura et al. | |
| 2013/0279543 A1 | 10/2013 | Torimoto et al. | |
| 2013/0345972 A1* | 12/2013 | Askarpour | G01C 19/36 |
| | | | 33/356 |
| 2014/0029136 A1 | 1/2014 | Sugii | |
| 2014/0129136 A1 | 5/2014 | Celia | |
| 2015/0198722 A1 | 7/2015 | Ben-Akiva et al. | |
| 2016/0018485 A1 | 1/2016 | Hautson et al. | |
| 2016/0116290 A1 | 4/2016 | Haverinen et al. | |
| 2016/0187142 A1* | 6/2016 | Larsen | G01P 15/14 |
| | | | 701/500 |
| 2016/0202064 A1 | 7/2016 | Haverinen | |
| 2017/0089706 A1 | 3/2017 | Ribeiro et al. | |
| 2017/0102467 A1 | 4/2017 | Nielsen et al. | |
| 2017/0299724 A1 | 10/2017 | Hsu et al. | |
| 2018/0283048 A1 | 10/2018 | Hage et al. | |
| 2018/0283882 A1 | 10/2018 | He et al. | |
| 2019/0128673 A1 | 5/2019 | Faragher et al. | |
| 2019/0277638 A1 | 9/2019 | Larsen | |
| 2020/0103477 A1 | 4/2020 | Berkovich et al. | |
| 2020/0264316 A1 | 8/2020 | Langstraat et al. | |
| 2020/0293508 A1 | 9/2020 | Tan et al. | |
| 2023/0384339 A1 | 11/2023 | Toutov et al. | |

FOREIGN PATENT DOCUMENTS

| | | |
|---|---|---|
| EP | 3971532 A1 | 3/2022 |
| KR | 20180072914 A | 7/2018 |
| WO | 2021067140 A1 | 4/2021 |

OTHER PUBLICATIONS

Search Report and Written Opinion from PCT Application No. PCT/IB2023/057136 dated Oct. 27, 2023.

Angelis, et al., An Experimental System for Tightly Coupled Integration of GPS and AC Magnetic Positioning, IEEE Transactions on Instrumentation and Measurement, vol. 65, No. 5, pp. 1232-1241, May 2016.

Ashraf, et al., Floor Identification Using Magnetic Field Data with Smartphone Sensors, www.mdpi.com/journal/sensors, Jun. 3, 2019.

Canciani, et al., Absolute Positioning Using The Earth's Magnetic Anomaly Field, Air Force Institute of Technology, Sep. 2016.

Canciani, et al., Magnetic Navigation, Air Force Institute of Technology.

Chen, et al., Quantum Physicists Found a New, Safer Way to Navigate, https://www.wired.com/story/quantum-physicists-found-a-new-safer-way-to-navigate/, Nov. 1, 2018.

Hernandez, et al., Steering Control of Automated Vehicles Using Absolute Positioning GPS and Magnetic Markers, IEEE Transactions On Vehicular Technology, vol. 52, No. 1, pp. 150-161, Jan. 2003.

Indooratlas, et al., Last meter accuracy through technology fusion, https://www.indooratlas.com/positioning-technology/, 2021.

Kim, et al., Indoor positioning system using geomagnetic anomalies for smartphones, International Conference on Indoor Positioning and Indoor Navigation, Nov. 2012.

Kim, et al., Indoor Positioning System Using Magnetic Field Map Navigation and an Encoder System, www.mdpi.com/journal/sensors, Mar. 22, 2017.

Lee, et al., Aerial Simultaneous Localization And Mapping Using Earth's Magnetic Anomaly Field, Air Force Institute of Technology, Mar. 21, 2019.

Li, et al., How feasible is the use of magnetic field alone for indoor positioning, International Conference on Indoor Positioning and Indoor Navigation, Nov. 2012.

Liu, et al., Fusion of Magnetic and Visual Sensors for Indoor Localization: Infrastructure-Free and More Effective, IEEE Transactions On Multimedia, vol. 19, No. 4, pp. 874-888, Apr. 2017.

Lohmann, et al., Magnetic maps in animals: nature's GPS, The Journal of Experimental Biology 210, pp. 3697-3705, Jul. 2007.

Noaa, et al., The World Magnetic Model—Uses, https://www.ngdc.noaa.gov/geomag/WMM/uses.shtml, Feb. 2020.

Prigge, et al., Signal Architecture for a Distributed Magnetic Local Positioning System, IEEE Sensors Journal, vol. 4, No. 6, pp. 864-873, Dec. 2004.

Riehle, et al., Indoor Waypoint Navigation via Magnetic Anomalies, IEEE Engineering in Medicine and Biology Society. Conference Aug. 2011.

Shockley, et al., Ground Vehicle Navigation Using Magnetic Field Variation, Air Force Institute of Technology, Sep. 2012.

Solin, et al., Modeling and Interpolation of the Ambient Magnetic Field by Gaussian Processes, Accepted To IEEE Transactions On Robotics, Mar. 21, 2018.

Vallivaara, et al., Simultaneous Localization And Mapping Using The Indoor Magnetic Field, University of Oulu Graduate School; University of Oulu, Faculty of Information Technology and Electrical Engineering Acta Univ. Oul. C 642, 2018.

AMS Application Team, Application Guidelines for MEMS Compass, www.emcu.it, 34 pages, 2013.

Amundson, Compass Assisted GPS for LBS Applications, www.honeywell.com/magneticsenors, 4 pages, 2006.

Arduino, Mega 2560, www.robotshop.com, 38 pages.

Asahikasei, 3-axis Electronic Compass, https://datasheetspdf.com/pdf/849782/AsabiKaseiMicrosystems/AK8963/1, 38 pages, Oct. 2013.

Caruso, et al., A New Perspective on Magnetic Field Sensing, https://aerospace.honeywell.com.cn/content/dam/aero/zh-cn/documents/lcam/products/sensors/technical-articles/ANewPerspectiveonMagneticFieldSensing_ta.pdf, 19 pages, May 1998.

Caruso, Applications of Magnetic Sensors for Low Cost Compass Systems, IEEE 2000. Position Location and Navigation Symposium (Cat. No. 00CH37062), 8 pages, 2002.

Caruso, Applications of Magnetoresistive Sensors in Navigation Systems, https://www.generationrobots.com/media/module%20boussole%203%20axes%20HMC5883L/29133-Compass-Module-Application-Note-2.pdf, 8 pages, 1998.

GY-271 Electronic Compass, https://www.botnroll.com/img/cms/HMC5883L-3-Axis-Arduino-test-Example.pdf, 7 pages.

Honeywell, 3-Axis Magnetic Sensor Hybrid HMC2003, www.honeywell.com/magneticsensors, Dec. 2017.

Honeywell, 3-Axis Digital Compass IC HMC5883L, www.magneticsensors.com, 20 pages, 2010.

Honeywell, Compass Heading Using Magnetometers, www.ssec.honewell.com. 2 pages, Jul. 1995.

Honeywell, 3-Axis Digital Compass IC HMC5983, www.magneticsensors.com, 28 pages, Sep. 2011.

Honeywell, Magnetic Gradiometer Circuit, https://aerospace.honeywell.com/content/dam/aerobt/en/documents/learn/products/sensors/application-notes/AN204_Magnetic_Gradiometer_Circuit.pdf, 1 page, Sep. 1995.

Honeywell, Magnetic Sensors, Compasses and Magnetometers, https://aerospace.honeywell.com/content/dam/aerobt/en/documents/learn/products/sensors/faqs/MagneticSensorsCompassesMagnetometers_FAQ1.pdf, 2 pages, May 2015.

Honeywell, Magnetic Sensor Hybrid Application Circuit, www.ssec.honeywell.com, 1 page, Sep. 1995.

Honeywell, Magnetic Sensors Product Catalog, www.honeywell.com, 12 pages, 2018.

Honeywell, Smart Digital Magnetometer HMR2300, www.magenticsensors.com, 13 pages, Feb. 2016.

Honeywell, Smart Digital Magnetometer in the Laboratory, https://aerospace.honeywell.com/content/dam/aerobt/en/documents/learn/products/sensors/application-notes/AN200_Smart_Digtial_Magnetometer.pdf, 2 pages.

Honeywell, Vehicle Detection Using AMR Sensors, www.honeywell.com, 10 pages, Aug. 2005.

LG, Motor Control Driver Chip, www.datasheet4u.com, 2 pages.

Microchip, ATmega640/V-1280/V-1281/V-2560/V-2561/V, http://www.atmel.com/avr, 436 pages.

(56) References Cited

OTHER PUBLICATIONS

Parallax, Compass Module 3-Axis HMC5883L, www.parallax.com, 7 pages, Nov. 2011.

QST, 3-Axis Magnetic Sensor QMC5883L, https://images.tuyacn. com/smart/A_TUYA/cropper/QMC5883L_Datasheet_1.0.pdf, 19 pages, Feb. 2016.

Texas Instruments, TCA9546A Low Voltage 4-Channel I2 C and SMBus Switch with Reset Function, www.ti.com, 31 pages, Nov. 2019.

Texas Instruments, TCA9548A Low-Voltage 8-Channel I2 C Switch with Reset, www.ti.com, 39 pages, Nov. 2019.

Extended European Search Report from corresponding EP Application No. 23803154.6 dated Jan. 30, 2026.

* cited by examiner

VCC
GND
SCL
SDA
DRDY

GY-271

700

702

700

L883
2122

222

702

222

222

222

Y
X
Z

CONTROLLING MOTION WITH MAGNETOMETERS

TECHNICAL FIELD

This disclosure generally relates to magnetic navigation and localization.

BACKGROUND

Gyroscopic systems (including heading-vertical gyroscope platforms) may be used to determine a vehicle's orientation angles (e.g. heading, pitch, and roll) in a joint rectangular coordinate frame relative to the Earth-Centered, Earth-Fixed (ECEF) coordinate frame, and those calculations may be used to control the vehicle. However, such systems are typically complex, often relying on suites of multiple different sources. Such systems are often relatively heavy (e.g. approximately 5 kg or more) and relatively expensive. As a result, the use of such systems on smaller unmanned or manned aerial vehicles (e.g. up to approximately 100 kg of takeoff weight) and other robots is often impractical.

In addition or as an alternative to gyroscopic systems, data from satellite navigation systems may be use to determine a vehicle's course. Many such systems operate on the premise of a Global Navigation Satellite System (GNSS). GNSS is a general term used to describe a network of satellites that can be used to produce position, navigation, and time (PNT) data sets. The Global Positioning System (GPS) is a widely used form of GNSS. Regional applications of such systems are also used to generate more regionally specific PNT data. For example, Galileo can be used in Europe; GLONASS can be used in Russia; and the BeiDou Navigation Satellite System (BDS) can be used in China.

GNSSs can have failure points. For example, some GNSSs lose reliability when operated inside buildings or in areas where network communication to the device is intermittent. Some GNSSs lose reliability when operated in dense city environments where large buildings interfere with communication signals. Some GNSSs lose reliability when operated in areas such as caves, tunnels, and mountains that impede location devices' reception of signals from GNSS satellites. Moreover, some GNSSs are susceptible to malicious attacks by electronic interference or physical intervention that degrade their reliability.

DESCRIPTION OF EXAMPLE EMBODIMENTS

Particular embodiments facilitate autonomous motion of a robot (which may include a UAV, UGV, UUV, or USV) along a route recorded on a data-storage device. In particular embodiments, one or more magnetic fields are recorded along the route and the robot then navigates that route based at least in part on data received from magnetometers or other sensors on the robot. In particular embodiments, recorded magnetic data along a route may be used for information support of navigation and motion-control systems of autonomous robotic systems. In particular embodiments, a robot autonomously or semi-autonomously navigates a route using a magnetic map of the route or an environment of the route. In particular embodiments, a person navigates a route using a magnetic map of the route or an environment of the route. Particular embodiments substantially obviate accelerometers and gyroscopic devices on board the robot.

Figure 1A:
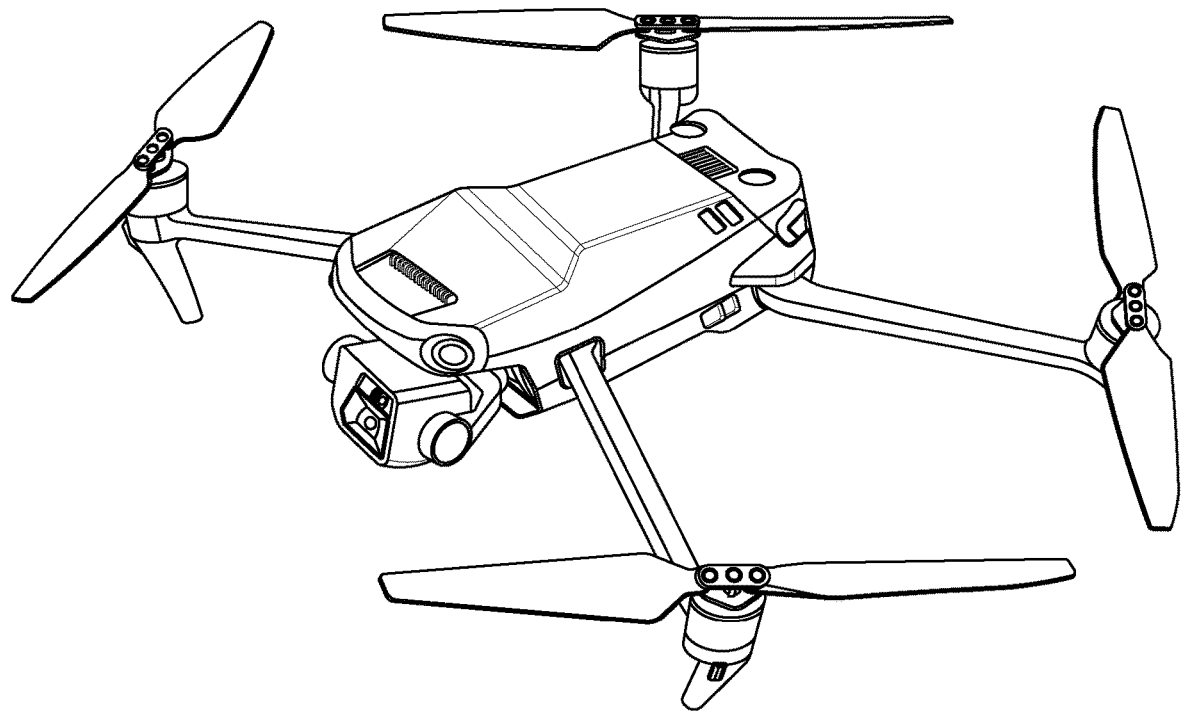
FIGS. 1A-1D illustrate example unmanned aerial vehicles (UAVs).
Figure 1B:
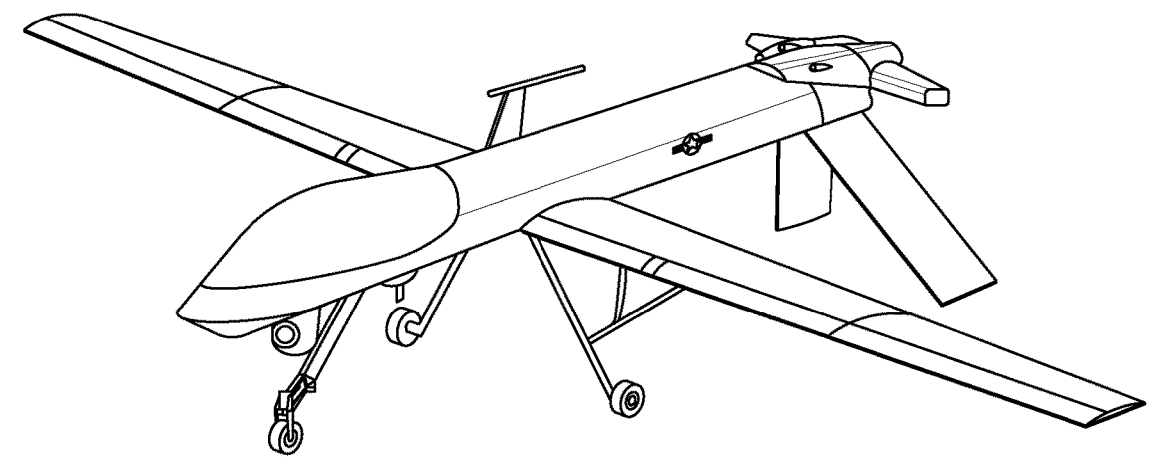
Figure 1C:
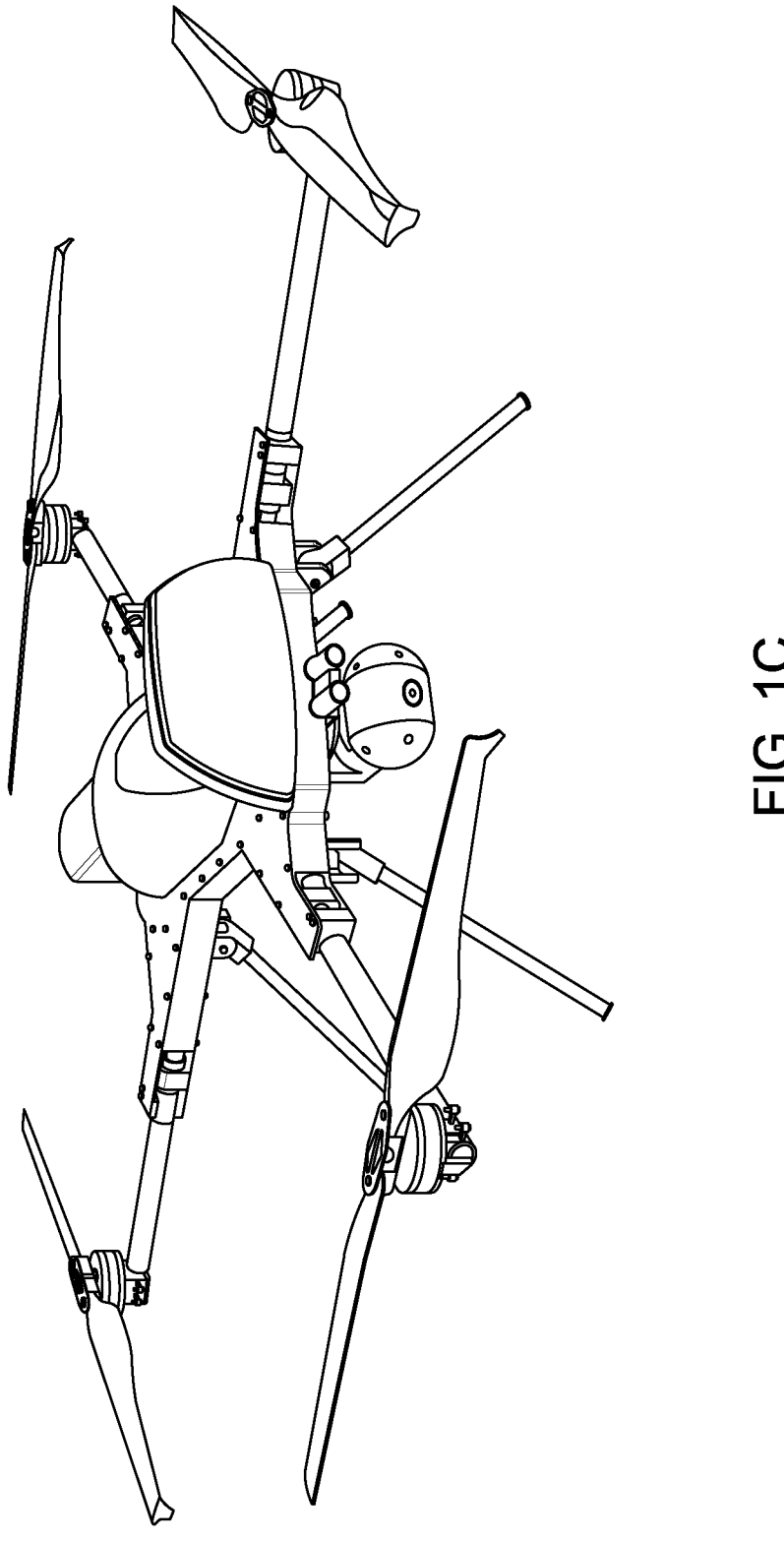
Figure 1D:
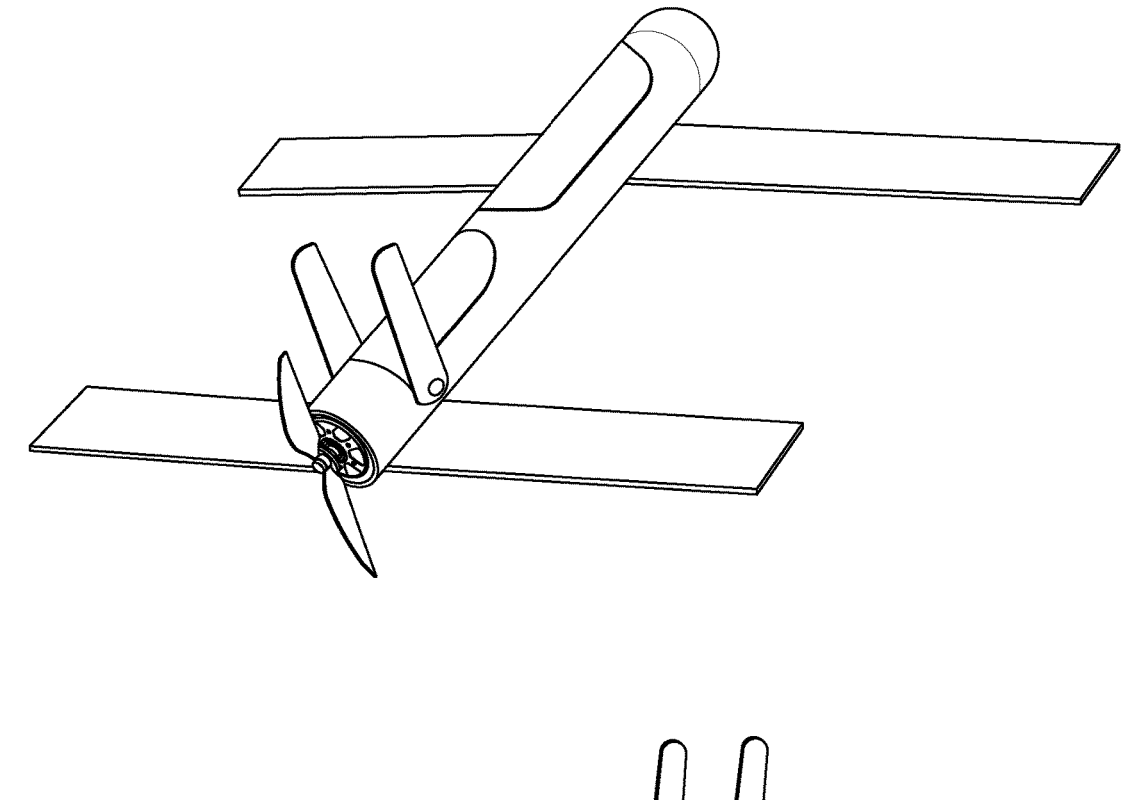

FIGS. 1A-1D illustrate example UAVs. FIG. 1A illustrates an example MAVIC 3 camera drone made by SZ DJI TECHNOLOGY. FIG. 1B illustrates an example U.S. Air Force MQ-1 Predator drone. FIG. 1C illustrates an example KARGU rotary-wing attack drone made by STM SAVUNMA TEKNOLOJILERI MÜHENDISLIK VE TICARET. FIG. 1D illustrates an example ALPAGU fixed-wing attack drone, also made by STM SAVUNMA TEKNOLOJILERI MÜHENDISLIK VE TICARET. Although particular UAVs are described and illustrated herein, this disclosure contemplates any suitable UAVs. In particular embodiments, a UAV is an aircraft without a human pilot, crew, or passengers on board. A UAV may be a component of an unmanned aircraft system (UAS), which may include a ground-based or other controller and a system of communication with the UAV. Herein, reference to a UAV may encompass a UAS, and vice versa, where appropriate. One or more functions of a UAV (including but not limited to flight of the UAV) may be controlled remotely by one or more human operators or with a suitable degree of autonomy (such as, for example, autopilot assistance or, as another example, full autonomy with no provision for human intervention or other control). A remotely piloted aircraft (RPA) may be an aircraft that is flown remotely by one or more human operators. Herein, reference to a UAV may encompass an RPA, and vice versa, where appropriate.

Figure 2A:
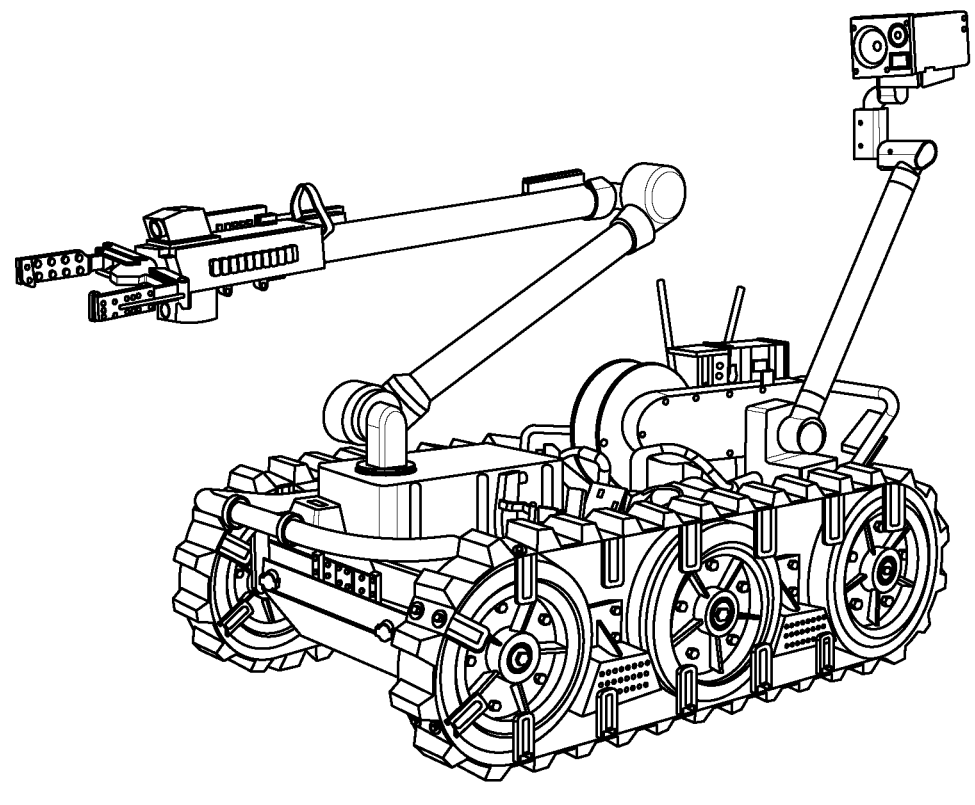
FIGS. 2A-2K illustrate example unmanned ground vehicles (UGVs).
Figure 2B:
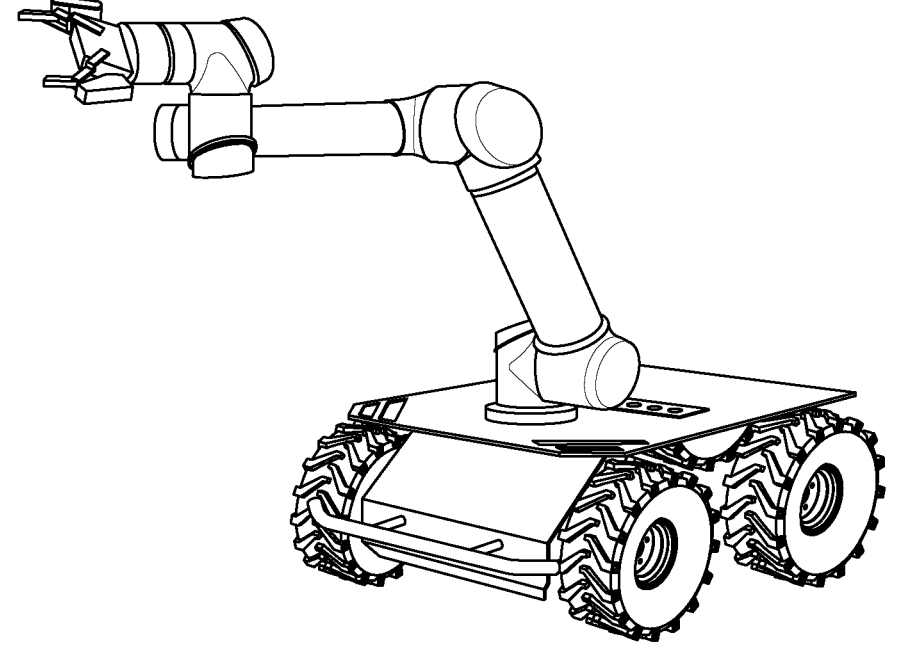
Figure 2C:
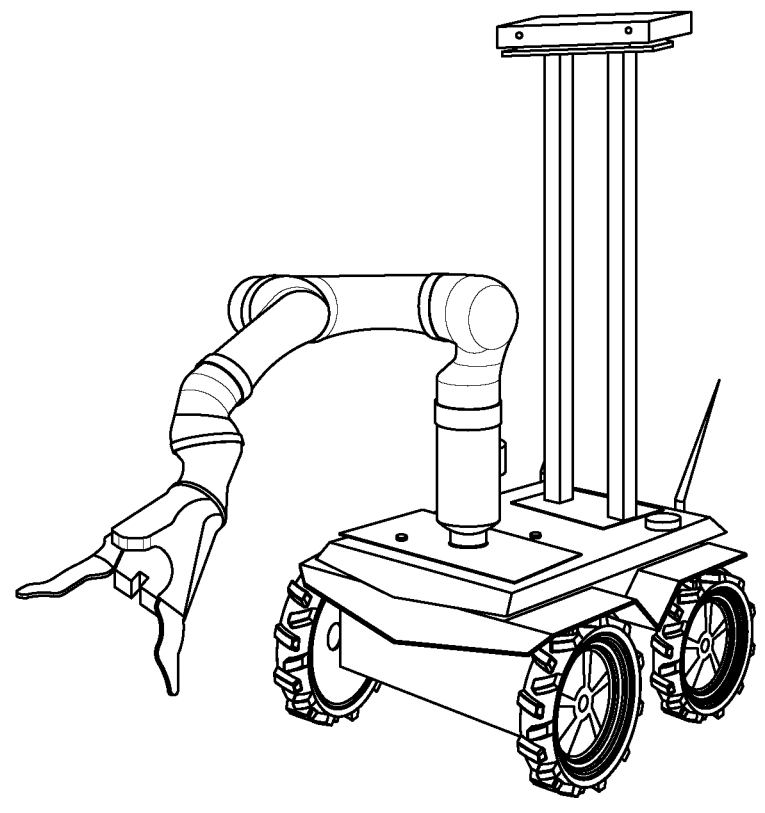
Figure 2D:
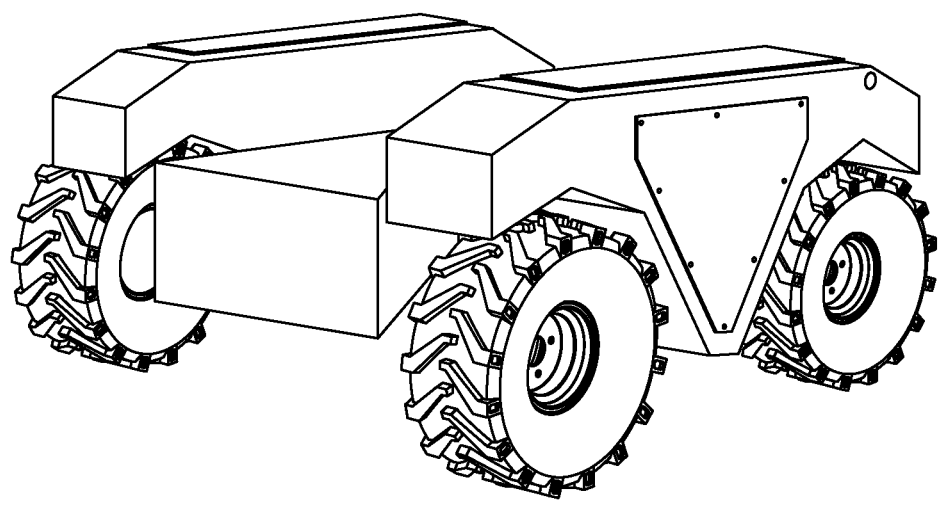
Figure 2E:
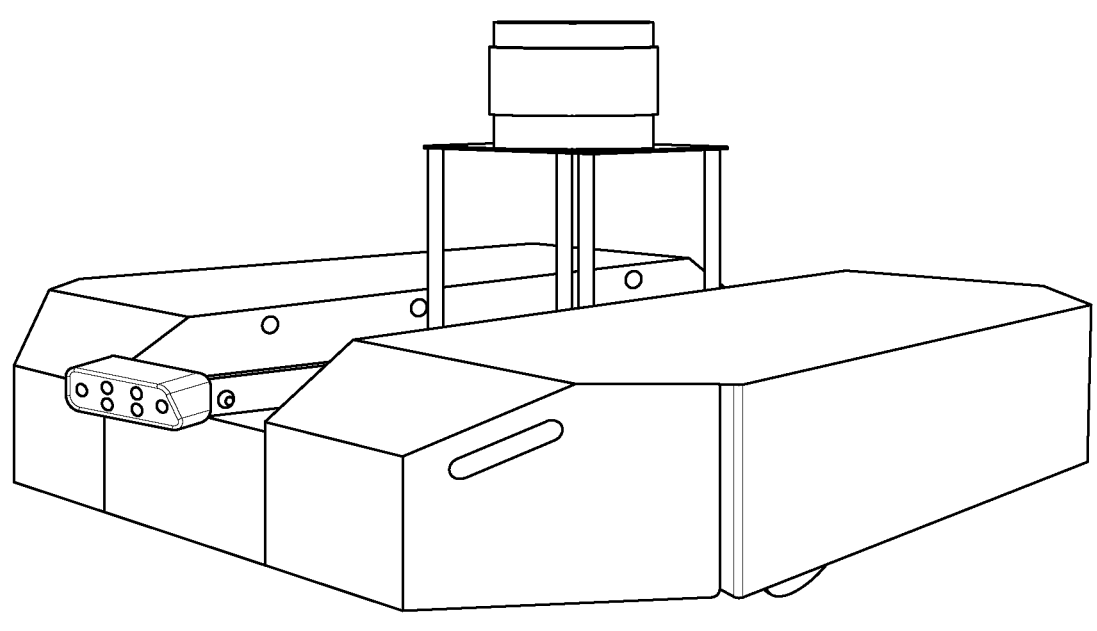
Figure 2F:
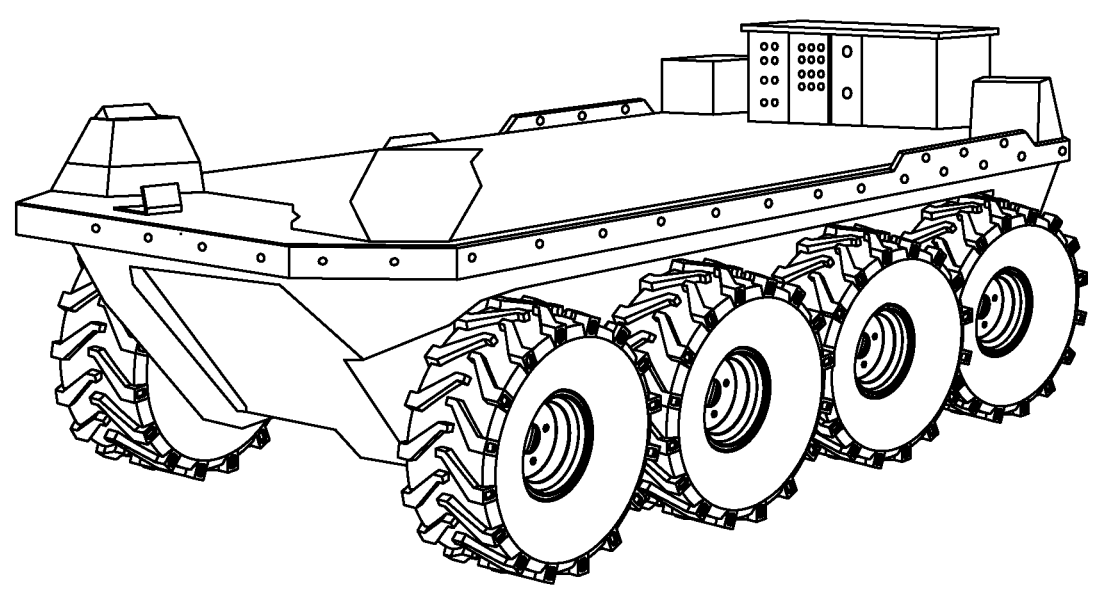
Figure 2G:
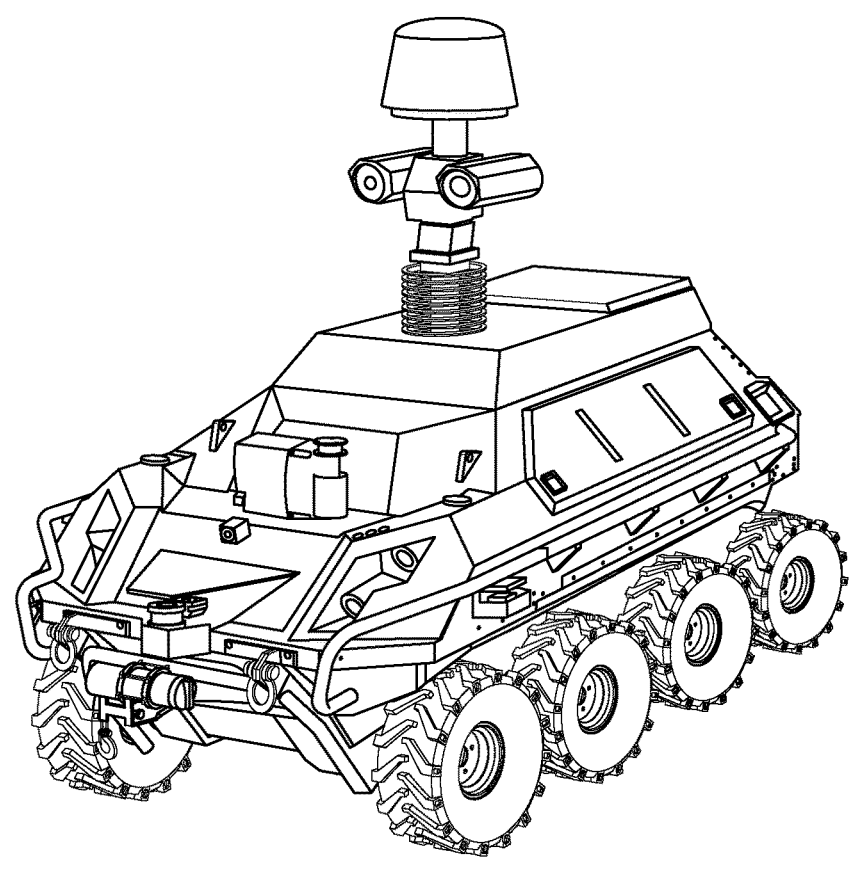
Figure 2H:
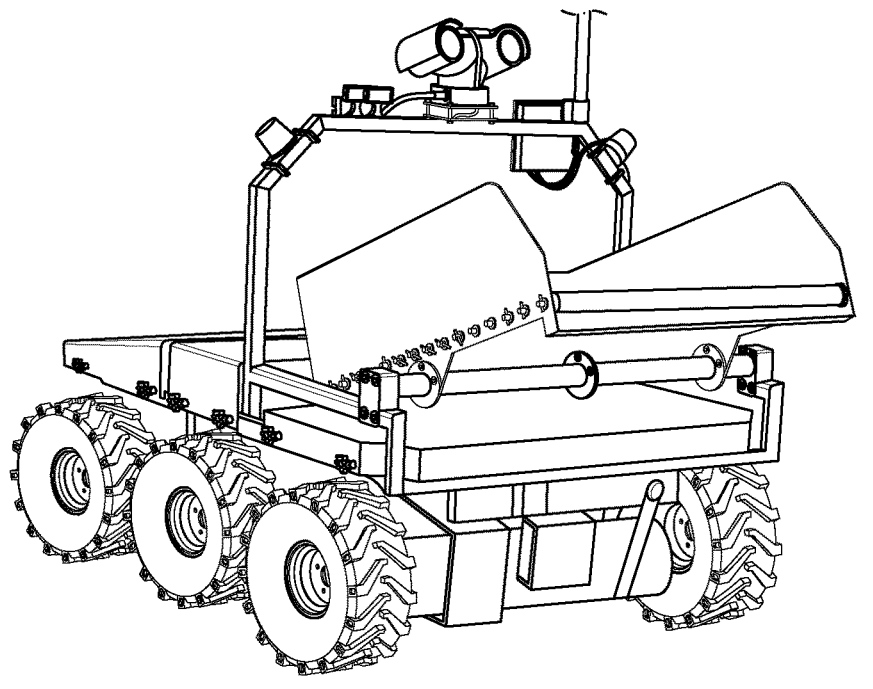
Figure 2I:
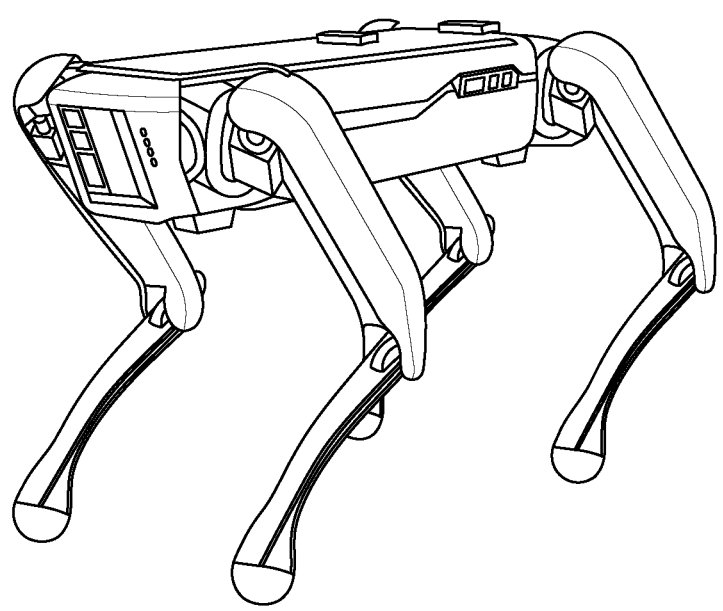
Figure 2J:
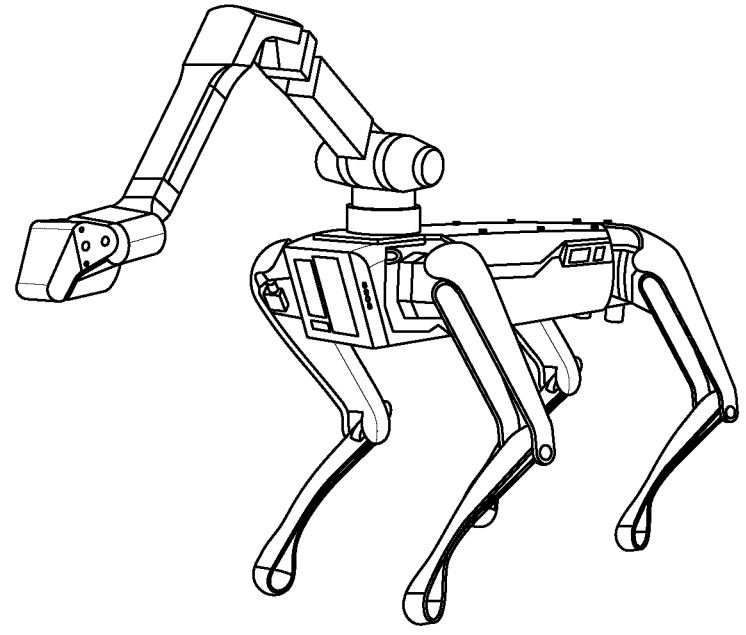
Figure 2K:
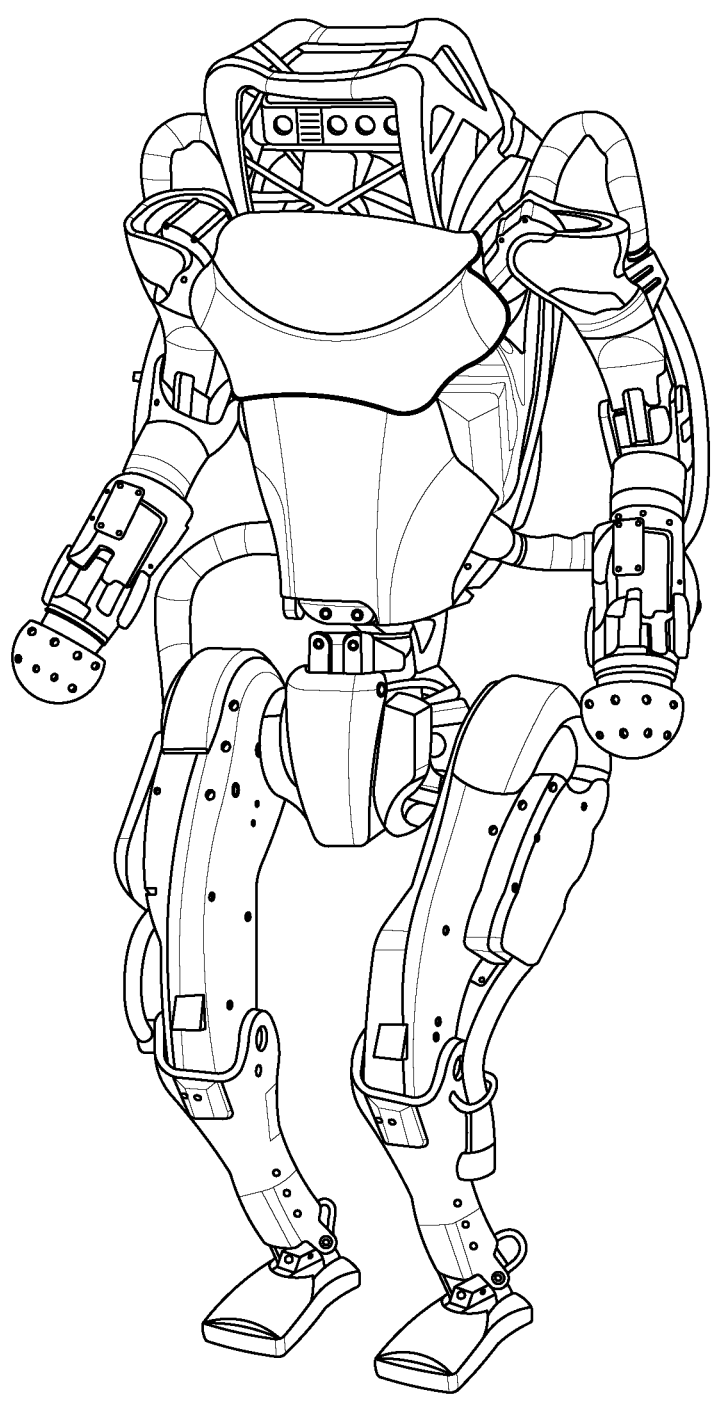

FIGS. 2A-2D illustrate example UGVs. FIG. 2A illustrates an example CENTAUR robot made by TELEDYNE FLIR. FIG. 2B illustrates an example HUSKY UGV made by CLEARPATH ROBOTICS, fitted with a mobile manipulation arm. FIG. 2C illustrates an example JACKAL UGV made by CLEARPATH ROBOTICS, fitted with a mobile manipulation arm and a stereo camera. FIG. 2D illustrates an example WARTHOG UGV made by CLEARPATH ROBOTICS. FIG. 2E illustrates an example DINGO indoor robot made by CLEARPATH ROBOTICS. FIG. 2F illustrates an example MOOSE UGV also made by CLEAR- PATH ROBOTICS. FIG. 2G illustrates an example MIS-
SION MASTER autonomous unmanned ground vehicle
(A-UGV) made by RHEINMETALL, fitted with sensors for
detecting chemical, biological, radiological, and nuclear
(CBRN) threats. FIG. 2H illustrates an example unmanned
baggage handler made by RHEINMETALL. FIG. 2I illus-
trates an example SPOT robot made by BOSTON DYNAM-
ICS. FIG. 2J illustrates another example SPOT robot, fitted
with a mobile manipulation arm. FIG. 2K illustrates an
example ATLAS robot made by BOSTON DYNAMICS.
Although particular IAA's are described and illustrated
herein, this disclosure contemplates any suitable UGVs. In
particular embodiments, a UGV is a vehicle that operates in
contact with the ground without a human on board. A UGV
may have a set of sensors for observing its environment, and
one or more functions of the UGV may be controlled
remotely by one or more human operators or with a suitable
degree of autonomy (such as, for example, autopilot assis-
tance or, as another example, full autonomy with no provi-
sion for human intervention or other control). A UGV may
use any suitable method(s) of terrestrial locomotion. For
example, a UGV may move from one location to another by
rolling, sliding, walking, running, hopping, metachronal
motion, slithering, brachiating, or any suitable combination
of the foregoing using one or more wheels, treads, legs, or
other structures. A UGV may include a conventional land
vehicle, such as for example a forklift, conventional car,
truck, tractor, or tractor-trailer truck. A UGV may include
earth-moving, agricultural, or forestry equipment, such as
for example an excavator, backhoe loader, bulldozer, skid-
steer loader, motor grader, crawler loader, trencher, scraper,
dump truck, harvester, mower, baler, feller buncher, shovel
logger, or other equipment. Herein, reference to a UGV may
encompass an autonomous ground vehicle (AGV) or
autonomous vehicle, and vice versa, where appropriate.
Reference to a UGV may encompass a rover, and vice versa,
where appropriate.

Figure 3A:
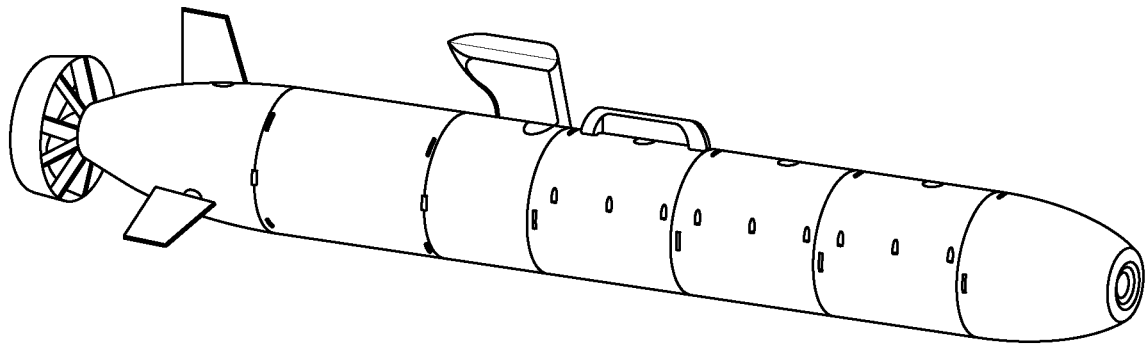
FIGS. 3A-3D illustrate example unmanned underwater vehicles (UUVs).
Figure 3B:
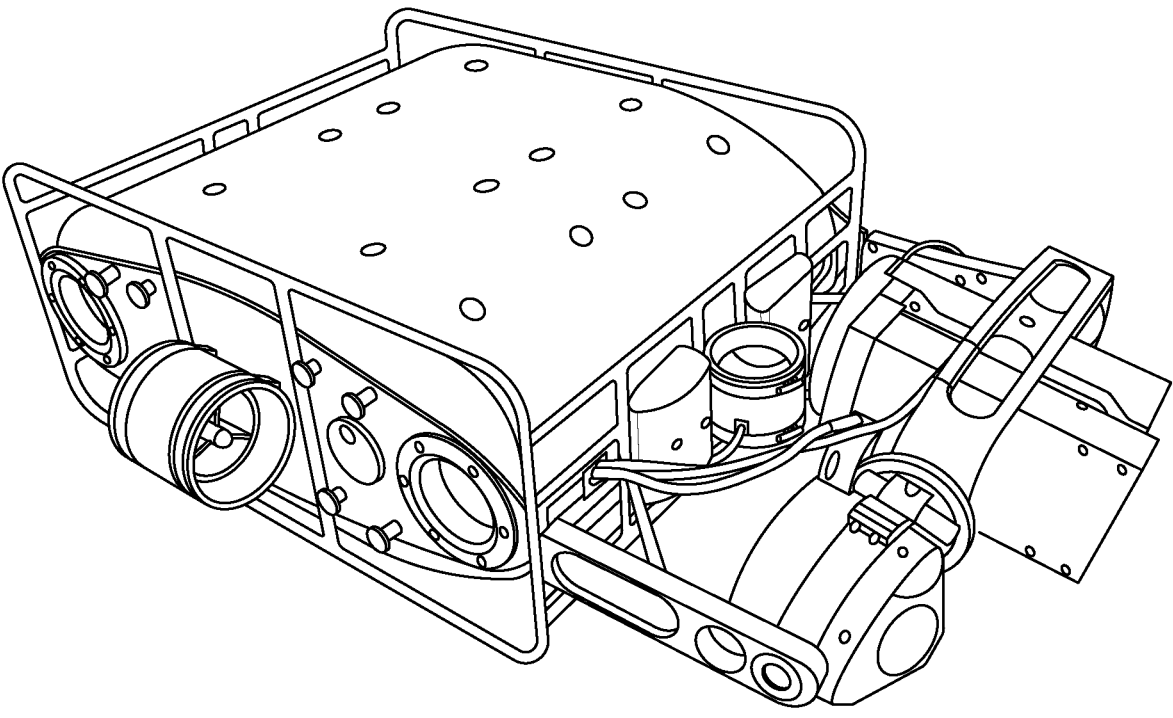
Figure 3C:
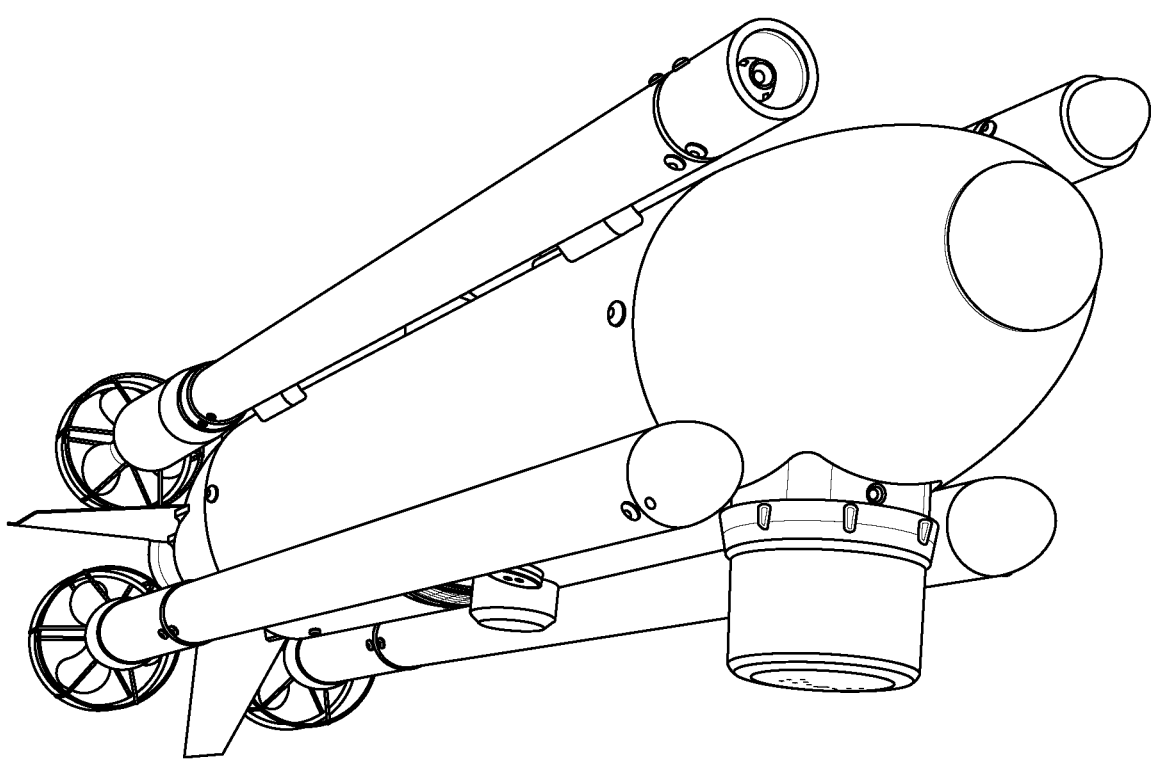
Figure 3D:
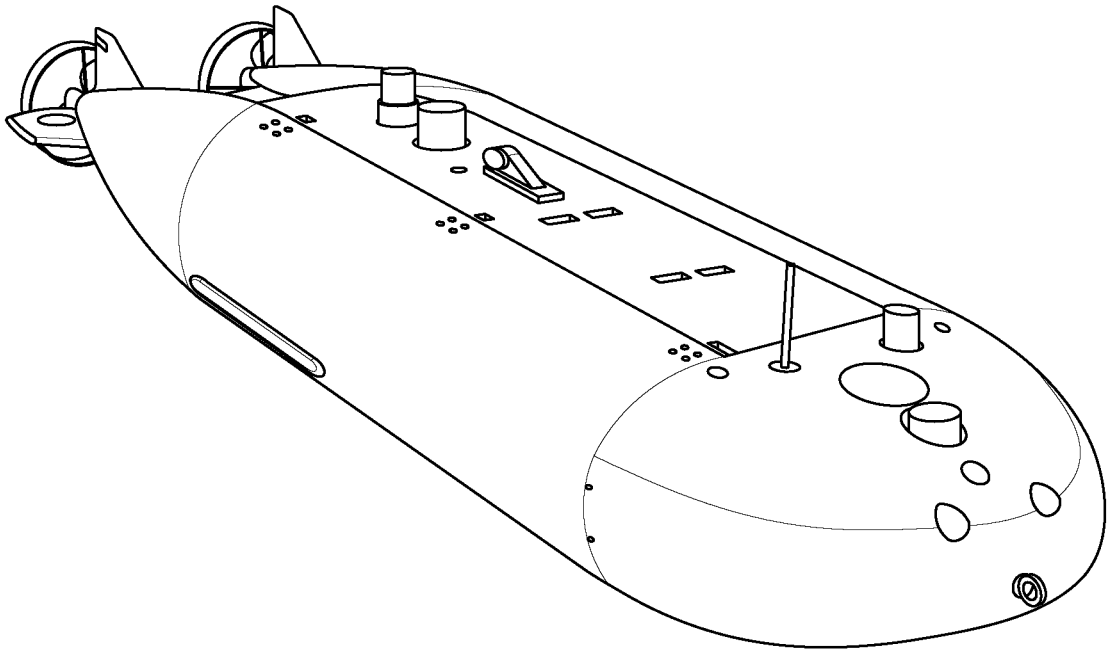

FIGS. 3A-3D illustrate example UUVs. FIG. 3A illus-
trates an example BLUEFIN-21 UUV made by GENERAL
DYNAMICS MISSION SYSTEMS. FIG. 3B illustrates an
example BLUEFIN HOVERING AUTONOMOUS
UNDERWATER VEHICLE (HAUV) made by GENERAL
DYNAMICS MISSION SYSTEMS. FIG. 3C illustrates an
example SEAOTTER made by ATLAS MARIDAN. FIG.
3D illustrates an example SEAFOX made by ATLAS
MARIDAN. Although particular UUVs are described and
illustrated herein, this disclosure contemplates any suitable
UUVs. In particular embodiments, a UUV is a submersible
vehicle that is able to operate underwater without a human
occupant. A UUV may be a remotely operated underwater
vehicle (ROUV) controlled remotely by one or more human
operators or one or more computer systems through one or
more wired or wireless connections. A UUV may be an
autonomous underwater vehicle (AUNT) operating without
direct human input.

Figure 4A:
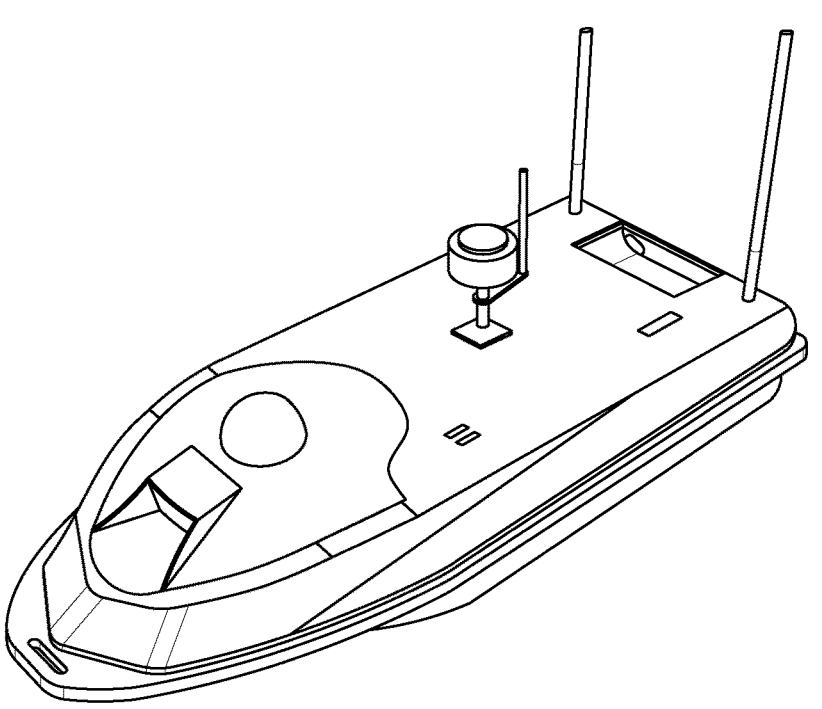
FIGS. 4A-4G illustrate example unmanned surface vessels (USVs).
Figure 4B:
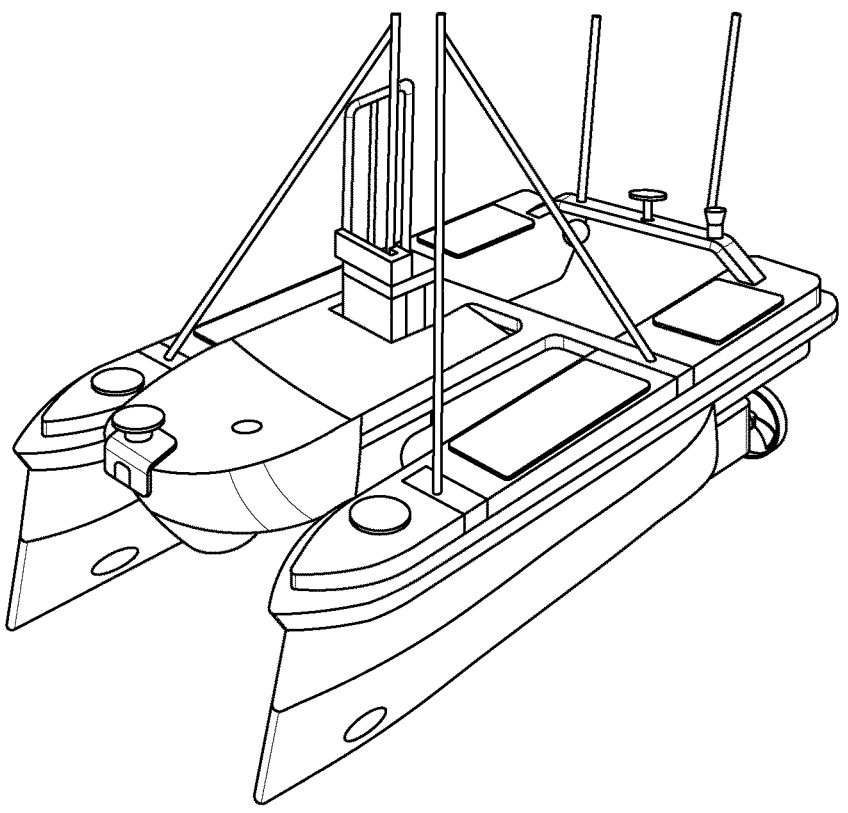
Figure 4C:
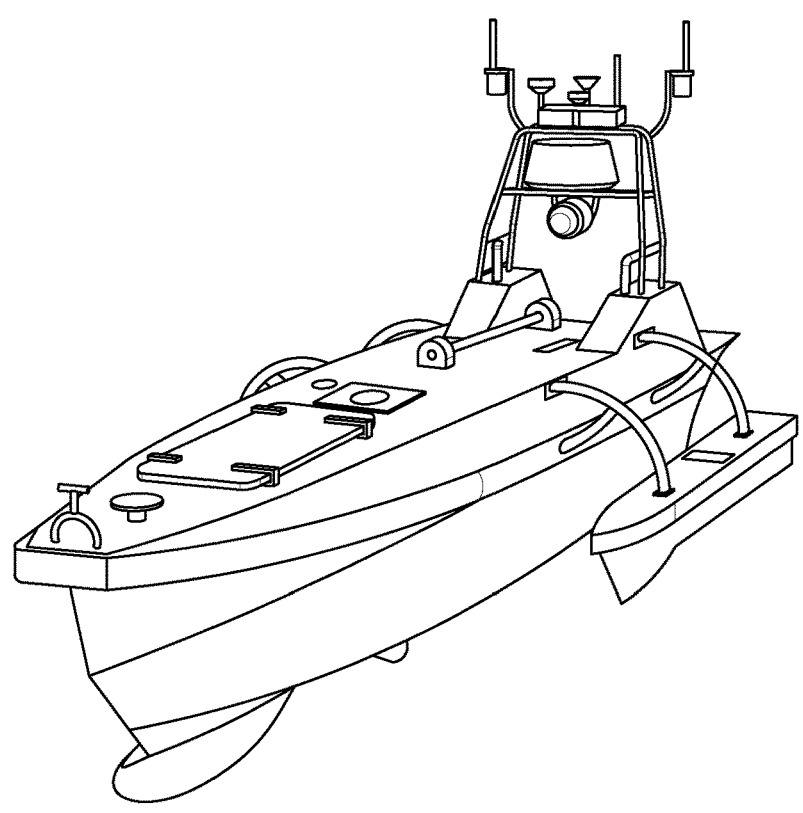
Figure 4D:
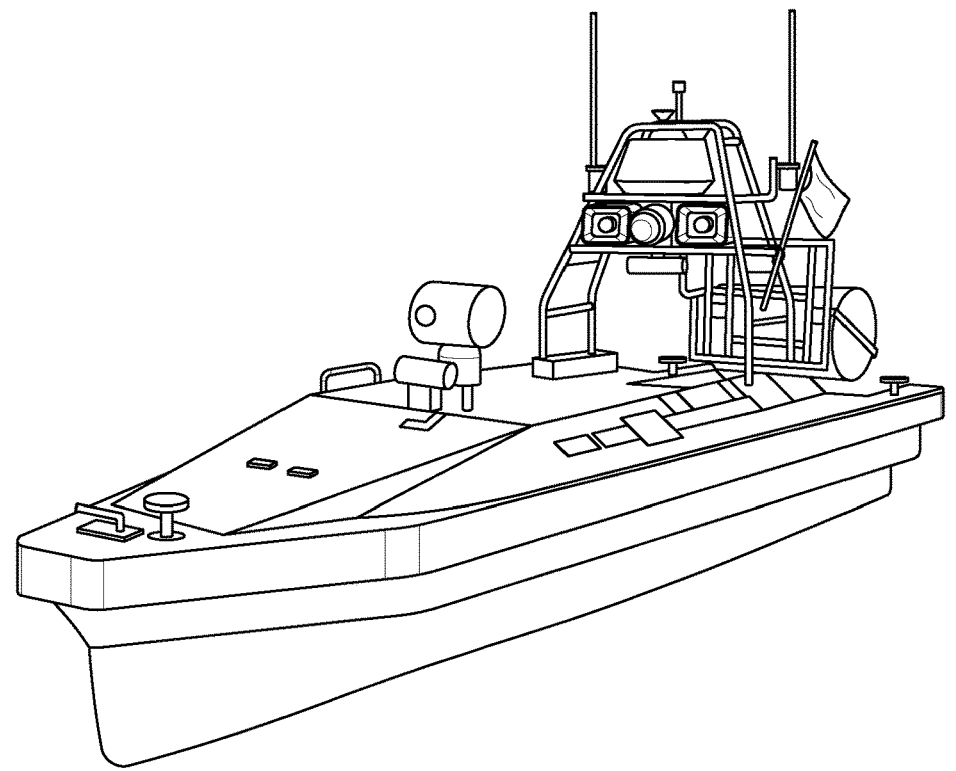
Figure 4E:
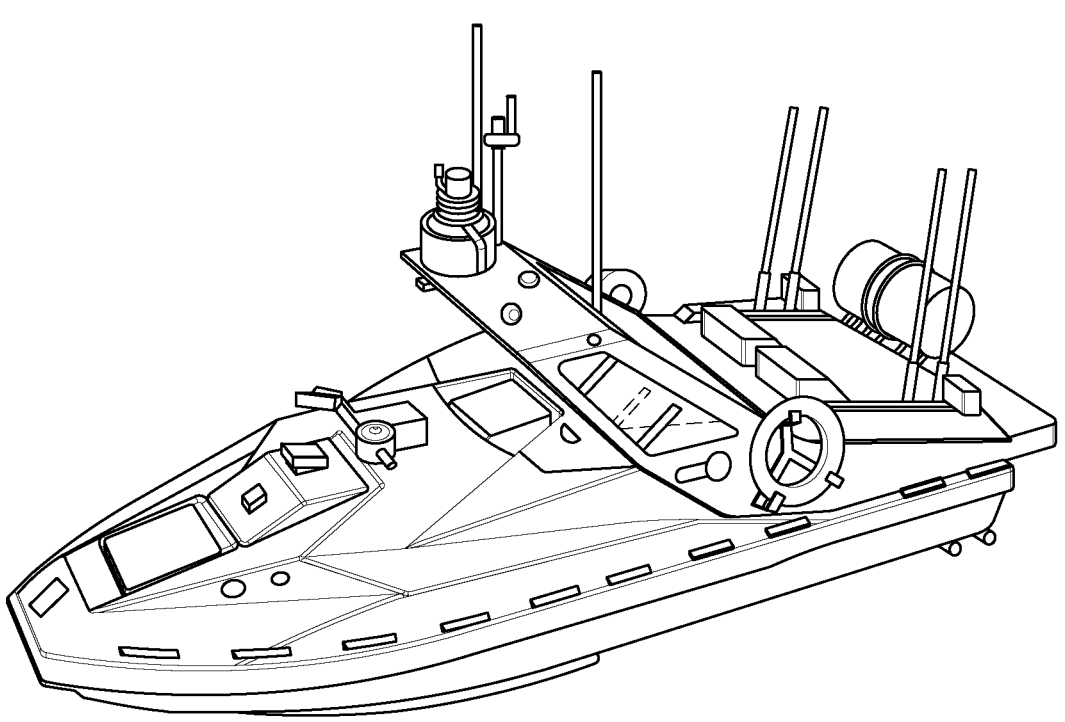
Figure 4F:
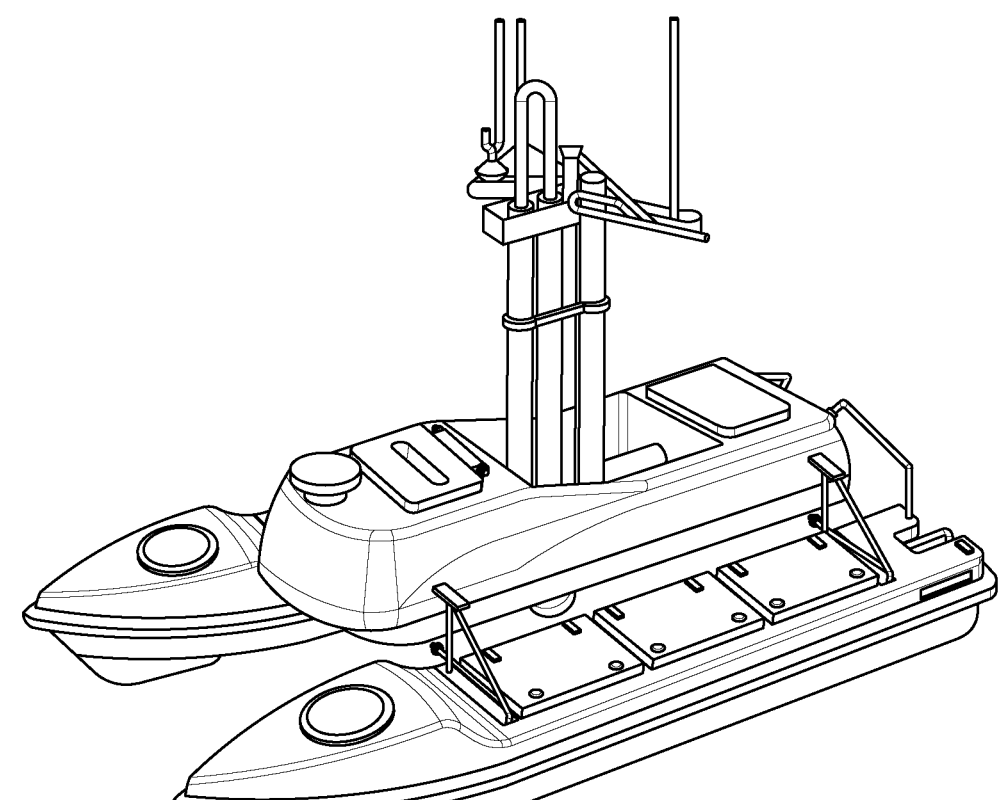
Figure 4G:
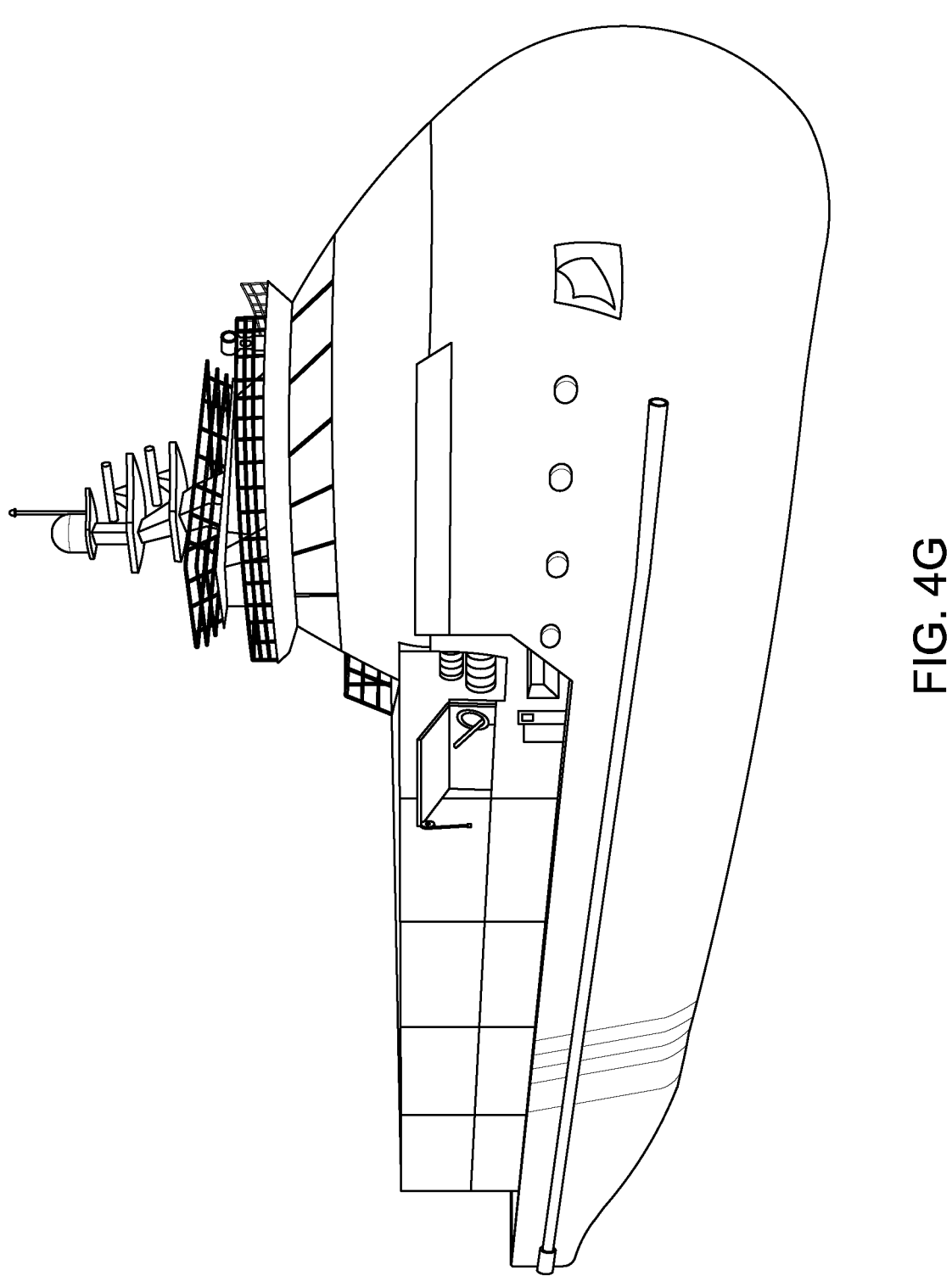

FIGS. 4A-4G illustrate example USVs. FIG. 4A illus-
trates an example SL40 USV made by OCEANALPHA
LTD. FIG. 4B illustrates an example M40 autonomous
hydrographic survey boat made by OCEANALPHA LTD.
FIG. 4C illustrates an example M80 autonomous survey
boat made by OCEANALPHA LTD. FIG. 4D illustrates an
example ME120 hydrographic USV made by OCEANAL-
PHA LTD. FIG. 4E illustrates an example M75 autonomous
surveillance and rescue vessel made by OCEANALPHA
LTD. FIG. 4F illustrates an example M300 autonomous
firefighting vessel made by OCEANALPHA LTD. FIG. 4G
illustrates an example autonomous cargo ship developed by OCEANALPHA LTD. Although particular USVs are
described and illustrated herein, this disclosure contemplates
any suitable USVs. In particular embodiments, a USV is a
boat or ship that operates on the surface of a body of water
without a crew. One or more functions of a USV may be
controlled remotely by one or more human operators or with
a suitable degree of autonomy (such as, for example, auto-
pilot assistance or, as another example, full autonomy with
no provision for human intervention or other control).
Herein, reference to a USV may encompass an unmanned
surface vehicle (USV), an autonomous surface vessel
(ASV), an autonomous surface vehicle (ASV), an uncrewed
surface vessel (USV), an uncrewed surface vehicle (USV),
or drone ship, and vice versa, where appropriate.

Herein, reference to a robot may encompass a drone, and
vice versa, where appropriate. Similarly, reference to a robot
may encompass a rover, and vice versa, where appropriate.
Reference to a robot may encompass a UAV, UGV, UUV,
USV, UAS, RPA, A-UGV, AGV, ROUV, AUV, or ASV, and
vice versa, where appropriate. Moreover, this disclosure
contemplates a robot having any suitable functions with any
suitable level of autonomy. For example, one or more
functions of a robot may have full autonomy, requiring no
human attention. One or more functions of a robot may have
conditional autonomy, requiring no human attention in par-
ticular circumstances but requiring human control in other
circumstances. One or more functions of a robot may have
partial autonomy, assisting a human operator by controlling
one or more aspects of that function. One or more functions
of a robot may have no autonomy, requiring full human
control. Although particular levels of autonomy are
described herein, this disclosure contemplates any suitable
levels of autonomy. Furthermore, this disclosure contem-
plates a robot having any suitable level of remote control or
onboard control. For example, one or more functions of a
robot may be controlled by one or more humans or one or
more computer systems that are on board the robot. One or
more functions of a robot may be controlled by one or more
humans or one or more computer systems that are remote
from or otherwise not on board the robot, with one or more
wired or wireless connections to the robot. One or more
functions of a robot may be controlled by one or more
humans or one or more computer systems that are on board
the robot while one or more other functions of the robot are
controlled by one or more humans or one or more computer
systems that are not on board the robot. Example functions
of a robot include, but are not limited to, translating or
otherwise moving from one location to another, e.g., on land,
in air, or in or on a body of water. Although particular
functions of a robot are described and illustrated herein, this
disclosure contemplates any suitable functions of a robot.

Although particular embodiments are described or illus-
trated herein by way of example and not by way of limita-
tion, with reference to robots, this disclosure contemplates
any particular embodiments being incorporated into or used
with any suitable machines, instruments, devices, or other
apparatuses. For example, particular embodiments may be
incorporated into a mobile telephone and facilitate naviga-
tion or localization or creating or updating one or more
portions of a magnetic map using the mobile telephone (e.g.
by a user of the mobile telephone).

Figure 5:
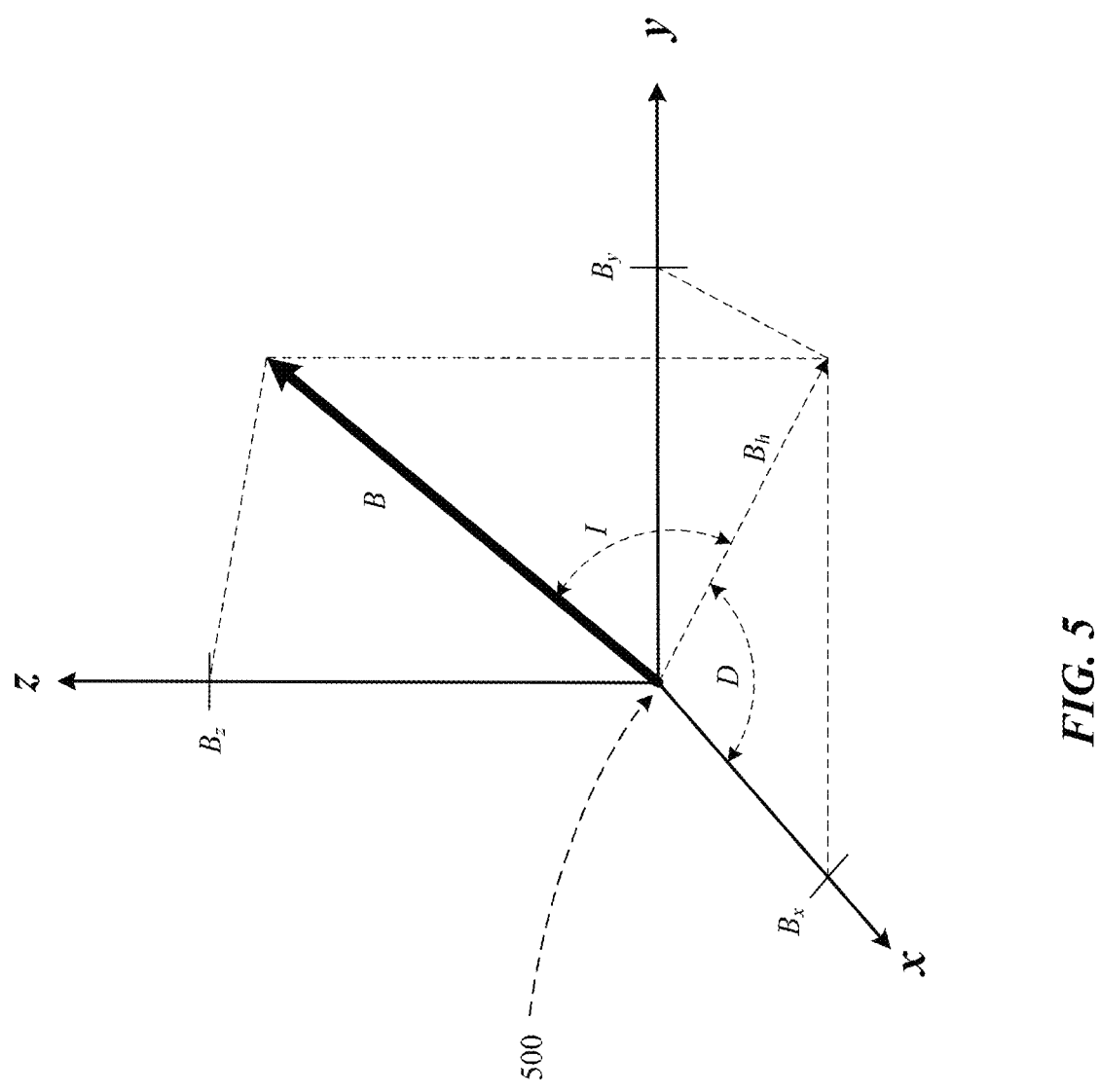
FIG. 5 illustrates example measurement of an example magnetic field at an example point in space.

FIG. 5 illustrates example measurement of an example
magnetic field at an example point 500 in space. In the
example of FIG. 5, B is a vector representing in a three-
dimensional coordinate frame the magnitude (or strength)
and direction of the magnetic field at point 500. The coor-
dinate frame may be a body-fixed coordinate frame relative to a device measuring the magnetic field, such as a magnetometer. $B_x$ is the x component of the magnitude of the magnetic field (which may be the projection of the strength of the magnetic field along the x axis of the coordinate frame), $B_y$ is the y component of the magnitude of the magnetic field (which may be the projection of the strength of the magnetic field along the y axis of the coordinate frame), and $B_z$ is the z component of the magnitude of the magnetic field (which may be the projection of the strength of the magnetic field along the z axis of the coordinate frame). $B_h$ is the magnitude of the projection of the vector of magnetic induction to a plane defined by the x and y axes of the coordinate frame, which may be a horizontal plane. D is the declination angle of the magnetic field relative to the coordinate frame, and I is the inclination angle of the magnetic field relative to the body-fixed coordinate frame. If $B_x$, $B_y$, and $B_z$ are measured components of the magnetic-induction vector, e.g., by a magnetometer, then with those values the following equations may be used to determine the magnitude of the magnetic-induction vector, |B|, the magnitude of the horizontal component of B, $|B_h|$, the declination angle of the magnetic field, D, and the inclination angle of the magnetic field, I:

$$|B| = \sqrt{B_x^2 + B_y^2 + B_z^2} \qquad (1)$$

$$|B_h| = \sqrt{B_x^2 + B_y^2} \qquad (2)$$

$$D = \cos^{-1}\left(\frac{B_x}{B_h}\right) \qquad (3)$$

$$I = \sin^{-1}\left(\frac{B_z}{B}\right) \qquad (4)$$

Although particular measurement of a particular magnetic field at a particular point in space is described and illustrated herein, this disclosure contemplates any suitable measurement of any suitable magnetic field at any suitable point in space.

A magnetometer is a device that measures an external magnetic field or magnetic dipole moment. In particular embodiments, a magnetometer measures the direction, strength, or relative change of a magnetic field at a point in space. In particular embodiments, a magnetometer includes one or more magneto-resistive (MR) or other sensors. In addition or as an alternative to including one or more MR sensors, a magnetometer may include one or more superconducting quantum-interference device (SQUID) sensors; search-coil sensors; nuclear-precession sensors; optically pumped sensors; fiber-optic sensors; fluxgate sensors; magneto-inductive sensors; anisotropic magneto-resistive (AMR) sensors; bias magnet field sensors; reed switches; Hall sensors; integrated Hall sensors; giant magneto-resistive (GMR) sensors; unpinned sandwich GMR sensors; antiferromagnetic-multilayer sensors; spin-valve sensors; spin-dependent tunneling (SDT) sensors; colossal magneto-resistive (CMR) sensors; or other suitable sensors for measuring a magnetic field. Although particular magnetometers including particular numbers of particular sensors are described and illustrated herein, this disclosure contemplates any suitable magnetometers including any suitable number of any suitable sensors.

A magnetometer may be contained in a semiconductor package (which may include, for example, a metal, glass, plastic, or ceramic casing). In particular embodiments, a magnetometer may be present alongside one or more Internet of Everything (IoT) sensors. In particular embodiments, a magnetometer may be used in conjunction with one or more other sensors, such as, for example, accelerometers, gyroscopes, or light detection and ranging (LIDAR) sensors. The semiconductor package containing the magnetometer may be mounted on a printed circuit board (PCB) along with one or more other components, which together may be referred to as an assembly (or module). The assembly may include an inter-integrated circuit (I²C) interface for communicating with one or more other devices, such as for example one or more controllers via one or more switches. An example switch includes the TCA9548A I²C multiplexer made by ADAFRUIT INDUSTRIES. An TCA9548A I²C multiplexer can switch up to eight magnetometers over an I²C bus. An TCA9548A I²C multiplexer has its own 0x70 I²C address, which can be changed using three pins. In particular embodiments, this enables the microcontroller to communicate with up to 64 magnetometers. Herein, reference to a magnetometer may encompass both the magnetometer and the semiconductor package containing it, where appropriate. Example magnetometers include the HMC5983 three-axis digital-compass integrated circuit (IC) made by HONEYWELL, the HMC5883L three-axis digital-compass IC made by HONEYWELL, the QMC5883L three-axis magnetic sensor made by QST, and the AK8963 three-axis electronic compass made by ASAHI KASEI MICRODE-VICES. Although particular magnetometers are described and illustrated herein, this disclosure contemplates any suitable magnetometers. Example assemblies (or modules) with magnetometers include a GY-271L electronic compass and a GY-273 compass module. Although particular assemblies (or modules) are described and illustrated herein, this disclosure contemplates any suitable assemblies (or modules). Herein, reference to a magnetometer may encompass both the magnetometer and the assembly it is mounted on, where appropriate.

Figure 6:
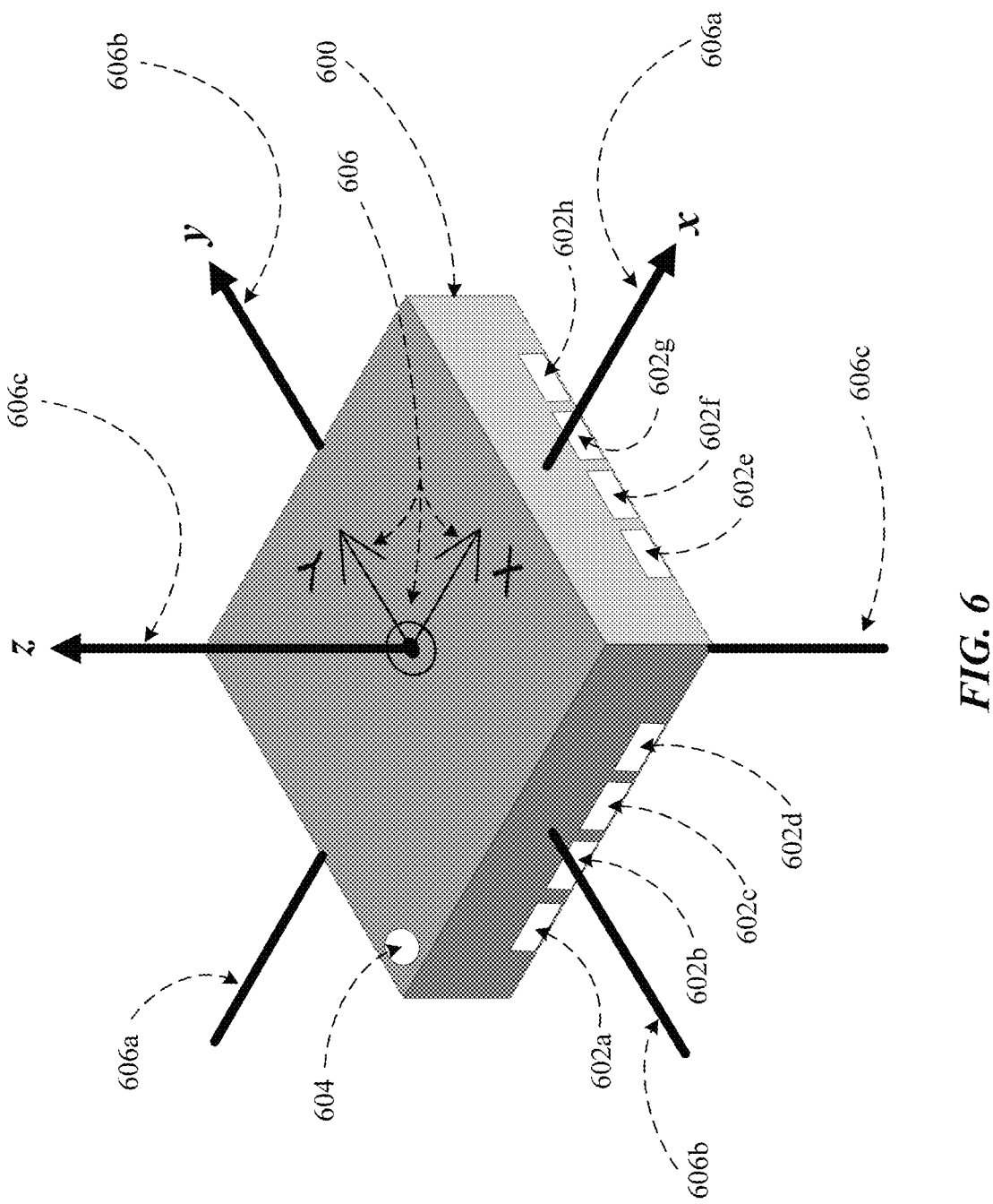
FIG. 6 illustrates an example magnetometer.

FIG. 6 illustrates an example semiconductor package 600 containing one or more example magnetometers. Although a particular semiconductor package with one or more particular magnetometers is described and illustrated herein, this disclosure contemplates any suitable semiconductor packages with any suitable number of any suitable magnetometers. Semiconductor package 600 may also be referred to as magnetometer 600. In the example of FIG. 6, magnetometer 600 has 16 pins 602, with four on each side. Pin 602a is pin 1, pin 602b is pin 2, pin 602c is pin 3, pin 602d is pin 4, pin 602e is pin 5, pin 602f is pin 6, pin 602g is pin 7, and pin 602h is pin 8. The remaining pins are not shown in FIG. 6. Each of these pins may have a predefined function, such as connecting magnetometer 600 to a clock signal, connecting magnetometer 600 to a power supply, defining a voltage swing for digital input and output to and from magnetometer 600, carrying input to magnetometer 600, or carrying output from magnetometer 600. Although particular functions of particular pins are described and illustrated herein, this disclosure contemplates any suitable functions of any suitable pins. Magnetometer 600 includes a first-pin indicator 604 that visually indicates the location of pin 1, which is the first pin moving counter-clockwise from visual indication 604. The pin numbers increase moving counter-clockwise from pin 1. In the example of FIG. 6, first-pin indicator 604 is a printed dot on the top of magnetometer 600. Although a particular pin indicator in a particular location on a particular magnetometer indicating a particular pin is described and illustrated herein, this disclosure contemplates any suitable number of any suitable pin indicators in any suitable locations on any suitable magnetometer indicating any suitable pins. For example, in addition or as an alternative to being a printed dot, visual indication 604 may be an indented dot or a notch.

In the example of FIG. 6, magnetometer 600 has a body-fixed coordinate frame that includes x axis 606*a*, *y* axis 606*b*, and *z* axis 606*c*. Axes 606*a*, 606*b*, and 606*c* are shown in FIG. 6 for explanatory purposes only and are not physical structures of magnetometer 600. Magnetometer 600 includes an orientation indicator 606 (which may be printed on the top of magnetometer 600) that visually indicates the orientation of the body-fixed coordinate frame of magnetometer 600. In orientation indicator 606, an arrow indicates the magnetic-field direction that generates a positive output reading in a normal-measurement configuration (or mode) of magnetometer 600. Although a particular magnetometer with a particular orientation indicator visually indicating a particular orientation of a particular coordinate frame is described and illustrated herein, this disclosure contemplates any suitable magnetometer with any suitable orientation indicator visually indicating any suitable orientation of any suitable coordinate frame. This disclosure also contemplates any suitable magnetometer with no orientation indicator.

In the presence of an external magnetic field, magnetometer 600 may determine the x, y, and z vector components of the magnetic field, $B_x$, $B_y$, and $B_z$, and output those values to a controller. For example, those values may be communicated, via a TCA9548A switch made by TEXAS INSTRUMENTS, to an ATMEGA2560 microcontroller made by MICROCHIP TECHNOLOGY mounted on an ARDUINO MEGA 2560 microcontroller board made by ARDUINO. $B_x$, $B_y$, and $B_z$ may be used to determine the magnitude of the magnetic-induction vector, $|B|$, the magnitude of the horizontal component of B, $|B_h|$, the declination angle of the magnetic field, D, and the inclination angle of the magnetic field, I, using equations (1), (2), (3), and (4) as described above.

Figures 7A, 7B:
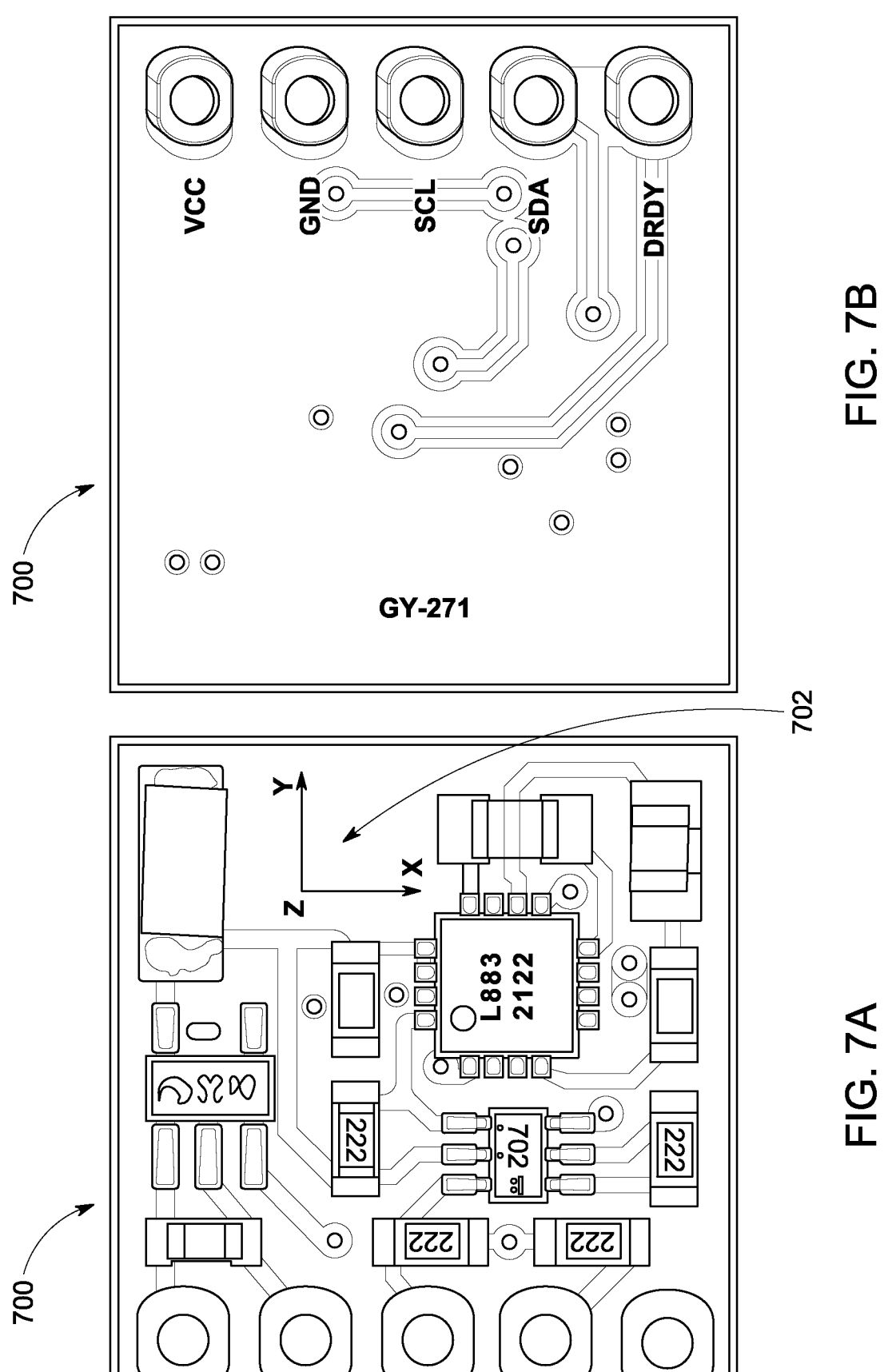
FIGS. 7A-7B illustrate an example module with an example magnetometer.

FIGS. 7A-7B illustrate an example module 700 with an example magnetometer. In the example of FIGS. 7A-7B, module 700 is a GY-271L electronic compass including an HMC5883L three-axis digital-compass IC made by HONEYWELL. FIG. 7A is a top view of module 700, and FIG. 7B is a bottom view of module 700. Although a particular module with a particular magnetometer is described and illustrated herein, this disclosure contemplates any suitable module with any suitable magnetometer. Similar to magnetometer 600, module 700 has a body-fixed coordinate frame and includes an orientation indicator 702 that visually indicates the orientation of the body-fixed coordinate frame of module 700.

Figure 8:
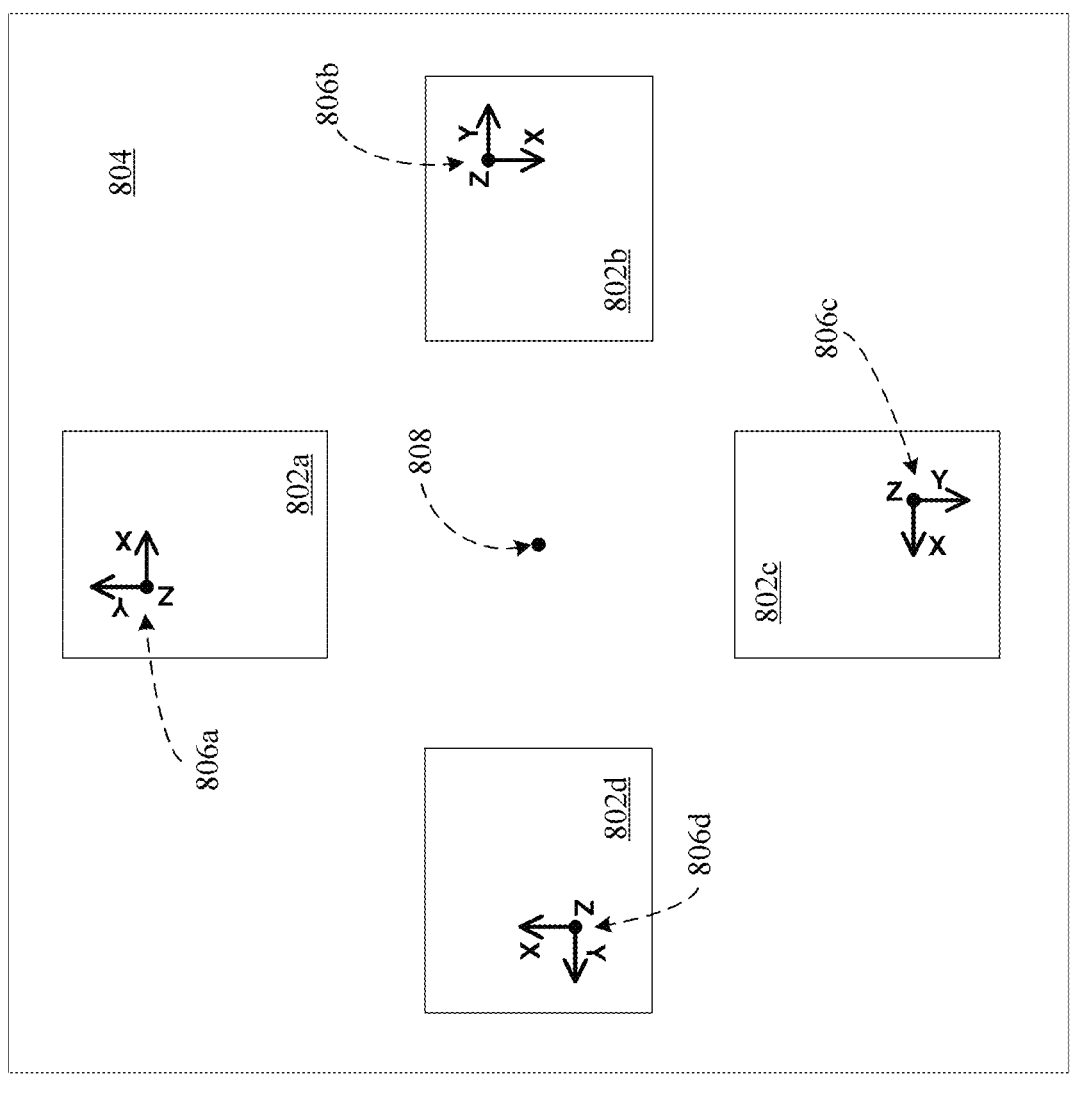
FIG. 8 illustrates an example sensor set including four example magnetometers.
Figure 9:
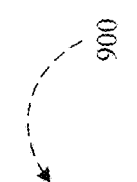
FIG. 9 illustrates an example sensor set including eight example magnetometers.

FIG. 8 illustrates an example sensor set 800 including four example magnetometers 802. In the example of FIG. 8, magnetometers 802 are arranged and oriented on a plane with a step of 90°. In particular embodiments, increasing the number of pairs of magnetometers decreases this step to 45° (as shown in FIG. 9), 22.5°, 11.5°, etc. In the example of FIG. 8, magnetometers 802 are mounted on a PCB or other board 804. One or more other components not shown in FIG. 8 may also be mounted on board 804. For example, magnetometers 802 may be coupled to a TCA9546A switch made by TEXAS INSTRUMENTS that is also mounted on board 804. Magnetometers 802 may each be a GY-271L electronic compass including an HMC5883L three-axis digital-compass IC made by HONEYWELL. In particular embodiments, the maximum number of GY-271L electronic compasses for a TCA9546A switch board is eight. For every additional eight GY-271L electronic compasses, an additional TCA9546A switch board is required.

Each magnetometer 802 has a body-fixed coordinate frame, and the orientation of the body-fixed coordinate frame of each magnetometer 802 is indicated by an orientation indicator 806. Board 804 may be substantially flat and define a plane. One or more magnetometers 802 may each be mounted on board 804 such that the plane defined by the x and y axes of the body-fixed coordinate frame of magnetometer 802 is substantially parallel to the plane defined by board 804. In addition or as an alternative, one or more magnetometers 802 may each be mounted on board 804 such that there is an acute angle between the plane defined by the x and y axes of the body-fixed coordinate frame of magnetometer 802 and the plane defined by board 804. By the angle of inclination of a magnetometer 802, the following is meant:

1. The optimal angle of orientation (only along the y axis (north) or only along the x axis) of magnetometer 802 when the robot or other apparatus or other apparatus (such as for example a mobile telephone or other mobile device) moves at certain latitudes. This depends on I, but it does not always have to match. It ranges from 0° to about 90°.

2. The "technical" angle associated with an uneven fit of the chip (misalignment, etc.) on magnetometer 802 (a small "board" of a GY-271M module). To ensure alignment of the axes of magnetometer 802 with the substrate in the plane defined by board 804, magnetometer 802 may have a "technical" angle of inclination along the x or y axes relative to the plane defined by board 804.

Magnetometers 802 may be equidistant from a center 808 (or an axis of rotation) of board 804. Magnetometers 802 may be installed parallel to the plane defined by board 804. As an alternative, the inner side of each of one or more magnetometers 802 may be raised by the value h above the plane defined by board 804 (as described above).

Magnetometers 802 in sensor set 800 may be arranged in subsets, and magnetometers 802 in each subset may be oriented or configured relative to each other to generate predetermined combinations of output readings. For example, magnetometers 802 in sensor set 800 may be arranged in pairs. A first magnetometer 802 in each pair may be oriented or configured relative to a second magnetometer 802 in the pair such that the output readings of first magnetometer 802 coincide with the output readings of second magnetometer 802, if second magnetometer 802 is rotated 180° and set strictly in place of first magnetometer 802. The axis of rotation is a point equal to half the distance between the chips (sensing elements) of magnetometers 802 (modules GY-271M). In the example of FIG. 8, magnetometers 802*a* and 802*c* are arranged in a pair and oriented relative to each other such that the x axis of the body-fixed coordinate frame of magnetometer 802*a* is 180° from the x axis of the body-fixed coordinate frame of magnetometer 802*c*, with the x-axis arrow in orientation indicator 806*a* and the x-axis arrow in orientation indicator 806*c* pointing in opposite directions. Magnetometers 802*a* and 802*c* are also oriented relative to each other such that the y axis of the body-fixed coordinate frame of magnetometer 802*a* is 180° from the y axis of the body-fixed coordinate frame of magnetometer 802*c*, with the y-axis arrow in orientation indicator 806*a* and the y-axis arrow in orientation indicator 806*c* pointing in opposite directions. Similarly, in the example of FIG. 8, magnetometers 802*b* and 802*d* are arranged in a pair and oriented relative to each other such that the x axis of the body-fixed coordinate frame of magnetometer 802*b* is 180° from the x axis of the body-fixed coordinate frame of magnetometer 802*d*, with the x-axis arrow in orientation indicator 806*b* and the x-axis arrow in orientation indicator 806*d* pointing in opposite directions. Magnetometers 802*b* and 802*d* are also oriented relative to each other such that the y axis of the body-fixed coordinate frame of magnetometer 802*b* is 180° from the y axis of the body-fixed coordinate frame of magnetometer 802*d*, with the y-axis arrow in orientation indicator 806*a* and the y-axis arrow in orientation indicator 806*c* pointing in opposite directions. Although particular subsets of particular magnetometers with particular orientations or configurations relative to each other to generate particular predetermined combinations of particular output readings are described and illustrated herein, this disclosure contemplates any suitable subsets of any suitable magnetometers with any suitable orientations or configurations relative to each other generating any suitable predetermined combinations of any suitable output readings.

FIG. 9 illustrates an example sensor set 900 including eight example magnetometers 902. In the example of FIG. 9, magnetometers 902 are arranged and oriented on a plane with a step of 45°. Magnetometers 902 are mounted on a PCB or other board 904. One or more other components not shown in FIG. 9 may also be mounted on board 904. For example, magnetometers 902 may be coupled to a TCA9548A switch made by TEXAS INSTRUMENTS that is also mounted on board 904. Magnetometers 902 may each be a GY-271L electronic compass including an HMC5883L three-axis digital-compass IC made by HONEYWELL.

In particular embodiments, the sensors are equidistant from a center 904 (or an axis of rotation) of board 904. The distance from the axis to a magnetometer 902 is minimized when using planar technology (e.g. lithography). In such cases, each sensor may be dimensionless (i.e. a point). In particular embodiments, a sensor set (such as for example sensor set 800 or sensor set 900) may be presented as a single microchip.

Magnetometers 902 in sensor set 900 may be arranged in subsets, and magnetometers 902 in each subset may be oriented or configured relative to each other to generate predetermined combinations of output readings. For example, magnetometers 902 in sensor set 902 may be arranged in pairs. A first magnetometer 902 in each pair may be oriented or configured relative to a second magnetometer 902 in the pair such that the output readings of first magnetometer 902 coincide with the output readings of second magnetometer 902, if second magnetometer 902 is rotated 180° and set strictly in place of first magnetometer 902. The axis of rotation is a point equal to half the distance between the chips (sensing elements) of the GY-271M modules. In the example of FIG. 9, magnetometers 902*a* and 902*e* are arranged in a pair and oriented with respect to each other such that the x axis of the body-fixed coordinate frame of magnetometer 902*a* is 180° from the x axis of the body-fixed coordinate frame of magnetometer 902*e*, with the x-axis arrow in orientation indicator 906*a* and the x-axis arrow in orientation indicator 906*e* pointing in opposite directions. Magnetometers 902*a* and 902*e* are also oriented with respect to each other such that the y axis of the body-fixed coordinate frame of magnetometer 902*a* is 180° from they axis of the body-fixed coordinate frame of magnetometer 902*e*, with the y-axis arrow in orientation indicator 906*a* and the y-axis arrow in orientation indicator 906*e* pointing in opposite directions. In the example of FIG. 9, magnetometers 902*b* and 902*f* are similarly arranged and oriented relative to each other; magnetometers 902*c* and 902*g* are similarly arranged and oriented relative to each other; and magnetometers 902*d* and 902*h* are similarly arranged and oriented relative to each other. Although particular subsets of particular magnetometers with particular orientations or configurations relative to each other to generate particular predetermined combinations of particular output readings are described and illustrated herein, this disclosure contemplates any suitable subsets of any suitable magnetometers with any suitable orientations or configurations relative to each other generating any suitable predetermined combinations of any suitable output readings.

Although particular sensor sets including particular numbers of magnetometers in particular arrangements are described and illustrated, this disclosure contemplates any suitable sensor sets including any suitable numbers of any suitable magnetometers in any suitable arrangements. A sensor set may include magnetometers arranged and oriented on a two-dimensional shape, such as a square or octagon. For example, as shown in FIG. 8, a sensor set may include four magnetometers arranged and oriented on a square. As shown in FIG. 9, a sensor set may include eight magnetometers arranged and oriented on an octagon, but the same approach may be extended to cases of 16-sided figures, 32-sided figures, 64-sided figures, or figures with more than 64 sides. Although particular sensor sets arranged and oriented on particular two-dimensional shapes are described and illustrated, this disclosure contemplates any suitable sensor sets arranged and oriented on any suitable two-dimensional shapes. In addition or as an alternative, a sensor set may include magnetometers arranged and oriented on a three-dimensional shape, such as a polyhedron or a faceted sphere. For example, a sensor set may include eight or more magnetometers arranged and oriented on the facets of an octahedron, with each facet of the octahedron including one or more of the magnetometers. The sensor set may include four or more pairs of opposing magnetometers, with the magnetometers in each pair being oriented with respect to each other such that the x, y, or z axes of their respective body-fixed coordinate frames are 180° apart. As another example, a sensor set may include 12 or more magnetometers arranged and oriented on the facets of a dodecahedron, with each facet of the dodecahedron including one or more of the magnetometers. The sensor set may include two or more pairs of opposing magnetometers, with the magnetometers in each pair being oriented with respect to each other such that the x, y, or z axes of their respective body-fixed coordinate frames are 180° apart. As another example, a sensor set may include 20 or more magnetometers arranged and oriented on the facets of an icosahedron, with each facet of the icosahedron including one or more of the magnetometers. The sensor set may include two or more pairs of opposing magnetometers, with the magnetometers in each pair being oriented with respect to each other such that the x, y, or z axes of their respective body-fixed coordinate frames are 180° apart. As another example, a sensor set may include 360 or more magnetometers arranged and oriented around a faceted sphere. The sensor set may include 180 or more pairs of opposing magnetometers, with the magnetometers in each pair being oriented with respect to each other such that the x, y, or z axes of their respective body-fixed coordinate frames are 180° apart. In a sensor set with magnetometers arranged and oriented on a three-dimensional shape, one or more of the facets of the three-dimensional shape may include one magnetometer. In addition or as an alternative, one or more of the facets of the three-dimensional shape may include two or more opposing or non-opposing magnetometers, which may be arranged and oriented on a two-dimensional shape, such as a square or octagon or polygon or even a sphere. A resulting chip including a set of pairs of magnetometers (four, eight, 16, etc.) may be implemented using a planar technology (e.g. lithography).

In particular embodiments, a sensor set includes M magnetometers that form N=M/2 pairs of magnetometers. In each of one or more of the N pairs of magnetometers/and j+1, the first (j) magnetometer of the pair measures the strength (magnitude) and direction of a magnetic field and has a coordinate frame including axes $x_j$, $y_j$, $z_j$, which are 90° degrees from each other. The second (j+1) magnetometer of the pair measures the strength (magnitude) and direction of the magnetic field and has a coordinate frame including axes $x_{j+1}$, $y_{j+1}$, and $z_{j+1}$ axis, which are also 90° from each other. The $x_{j+1}$ axis and the $y_{j+1}$ axis are each approximately 180° from the $x_j$ axis and the $y_j$ axis, respectively. In particular embodiments, each of one or more of the magnetometers in each of one or more of the N pairs of magnetometers is installed on a base (such as for example board 804) with an acute angle between the plane defined by the base and the plane defined by the x and y axes of the coordinate frame of the magnetometer. The edge of the magnetometer closest to the center (or the axis of rotation) of the pair of magnetometers may be raised above the plane defined by the base and form an acute angle with it, and the edge of the magnetometer farthest from the center (or the axis of rotation) of the pair of magnetometers may be closer to the plane defined by the base. In particular embodiments, the magnetometers in each of one or more of the N pairs of magnetometers are at least approximately equidistant from the center (or the axis of rotation) of the pair of magnetometers. In particular embodiments, the N pairs of magnetometers all have the same axis of rotation and the angle about that axis between adjacent pairs of magnetometers is 360/N degrees.

In particular embodiments, in each of one or more of the N pairs of magnetometers, the second (j+1) magnetometer is positioned relative to the first (j) magnetometer such that the measurements of the magnetic field recorded by the second (j+1) magnetometer along each of the $x_{j+1}$ axis, the $y_{j+1}$ axis, and the $z_{j+1}$ axis when the second (j+1) magnetometer is rotated by 180° (and set at least approximately in the place of the first (j) magnetometer are at least approximately equal. If, during the rotation of the $j^{th}$ magnetometer around its axis at point Q, the corresponding recorded values of the magnetic induction are $B_{x1}$, $B_{y1}$, and $B_{z1}$, then, by rotating the adjacent magnetometer by 360/N degrees and moving it to the location of the $j^{th}$ magnetometer, the corresponding values $B_{x2}$, $B_{y2}$, and $B_{z2}$ will be at least approximately identical to $B_{x1}$, $B_{y1}$, and $B_{z1}$. In particular embodiments, the N pairs of magnetometers are located on the facets of a three-dimensional W-faceted surface.

A robot or other apparatus (such as for example a mobile telephone or other mobile device) may include one or more sensor sets that each include two or more magnetometers and use those sensor sets to generate a magnetic map or for navigation or localization using an existing magnetic map that. A magnetic map of an area may be created using a sensor set in a recording mode in which $B_x$, $B_y$, and $B_z$ at each point i along a route are received from the sensor set (e.g. from each magnetometer in the sensor set), processed by a processing module, and stored for each point i in the form of $B_{xk1}$, $B_{yk1}$, and $B_{zk1}$, with k indicating the map, e.g., on a secure digital (SD) card or other storage medium onboard or on or in the robot or other apparatus (such as for example a mobile telephone or other mobile device). The magnetic map may be created by trawling the area and forming a database from the current $B_x$, $B_y$, and $B_z$ for one or more selected regions of the area. Data may be recorded at each point of the magnetic map of the region with a step from point i to point i+1 with sufficient accuracy to form a magnetic map of the region.

Figure 10:
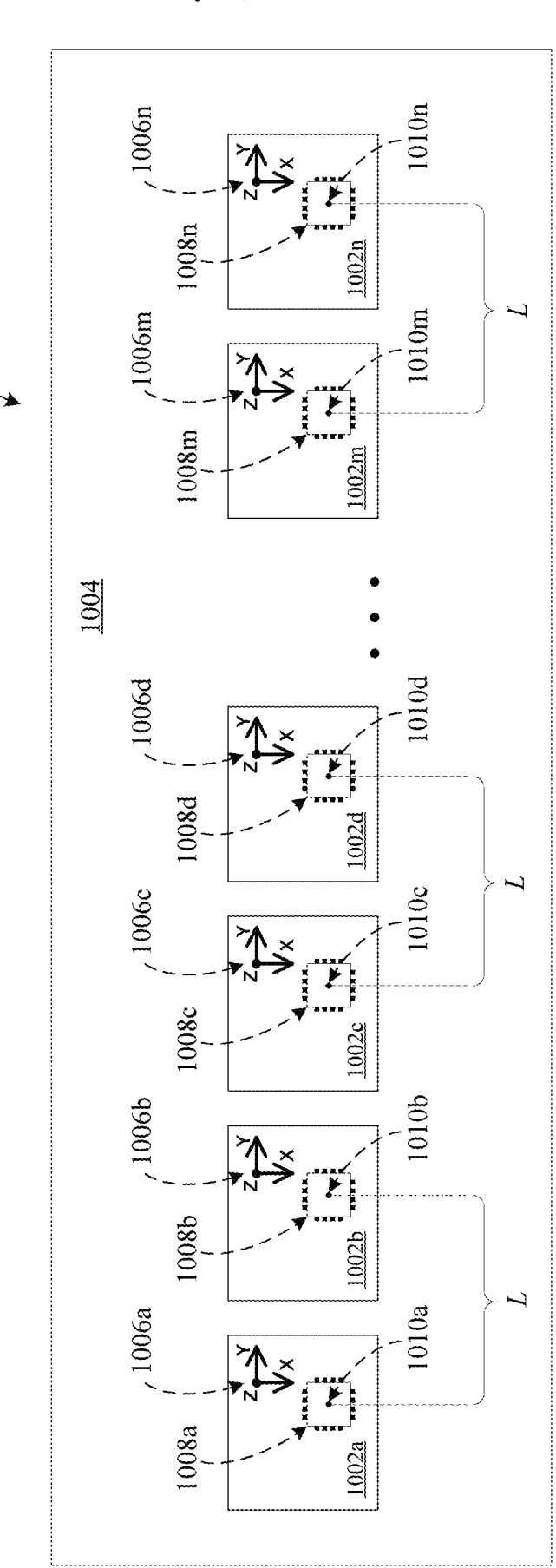
FIG. 10 illustrates an example sensor set including magnetometers for measuring a distance traversed or speed.

FIG. 10 illustrates an example sensor set 1000 including magnetometers 1002 for measuring a distance traversed by or a speed (e.g. an average speed) of a robot or other apparatus (such as for example a mobile telephone or other mobile device). In the example of FIG. 10, magnetometers 1002 are mounted on a PCB or other board 1004. One or more other components not shown in FIG. 10 may also be mounted on board 1004. For example, magnetometers 1002 may be coupled to a TCA9548A switch made by TEXAS INSTRUMENTS that is also mounted on board 1004. Magnetometers 1002 may each be a GY-271L electronic compass including an HMC5883L three-axis digital-compass IC made by HONEYWELL. In particular embodiments, the maximum number of GY-271L electronic compasses for a TCA9546A switch board is eight. For every additional eight GY-271L electronic compasses, an additional TCA9546A switch board is required.

In the example of FIG. 10, each magnetometer 1002 has a body-fixed coordinate frame, and the orientation of the body-fixed coordinate frame of each magnetometer 1002 is indicated by an orientation indicator 1006. Magnetometers 1002 in sensor set 1000 may be arranged in subsets. For example, magnetometers 1002 in sensor set 1000 may be arranged in pairs. In the example of FIG. 10, magnetometers 1002a and 1002b are arranged in a pair and oriented relative to each other such that the y axis of the body-fixed coordinate frame of magnetometer 1002a is substantially aligned with they axis of the body-fixed coordinate frame of magnetometer 1002b (at approximately 0° relative to each other or, alternatively, approximately 180° relative to each other), with the y-axis arrow in orientation indicator 1006a and the y-axis arrow in orientation indicator 1006b aligned with each other and pointing in the same direction (or alternatively in substantially opposite directions). Magnetometers 1002a and 1002b are also arranged relative to each other such that a center 1010a of semiconductor package 1008a containing the magnetic-field-sensing element(s) of magnetometer 1002a is a predetermined distance L from a center 1010b of semiconductor package 1008b containing the magnetic-field-sensing element(s) of magnetometer 1002b. Similarly, magnetometers 1002c and 1002d are arranged in a pair and oriented relative to each other such that they axis of the body-fixed coordinate frame of magnetometer 1002c is substantially aligned with the y axis of the body-fixed coordinate frame of magnetometer 1002d (at approximately 0° relative to each other or, alternatively, approximately 180° relative to each other), with the y-axis arrow in orientation indicator 1006c and the y-axis arrow in orientation indicator 1006d aligned with each other and pointing in the same direction (or alternatively in substantially opposite directions). Magnetometers 1002c and 1002d are also arranged relative to each other such that a center 1010c of semiconductor package 1008c containing the magnetic-field-sensing element(s) of magnetometer 1002c is a predetermined distance L from a center 1010d of semiconductor package 1008d containing the magnetic-field-sensing element(s) of magnetometer 1002d. Similarly, magnetometers 1002m and 1002n are arranged in a pair and oriented relative to each other such that the y axis of the body-fixed coordinate frame of magnetometer 1002m is substantially aligned with they axis of the body-fixed coordinate frame of magnetometer 1002n (at approximately 0° relative to each other or, alternatively, approximately 180° relative to each other), with the y-axis arrow in orientation indicator 1006m and the y-axis arrow in orientation indicator 1006n aligned with each other and pointing in the same direction (or alternatively in substantially opposite directions). Magnetometers 1002m and 1002n are also arranged relative to each other such that a center 1010m of semiconductor package 1008m containing the magnetic-field-sensing element(s) of magnetometer 1002m is a predetermined distance L from a center 1010n of semiconductor package 1008n containing the magnetic-field-sensing element(s) of magnetometer 1002n. Although particular subsets of particular magnetometers with particular orientations or arrangements relative to each other to measure a distance traversed by or a speed of a robot or other apparatus (such as for example a mobile telephone or other mobile device) are described and illustrated herein, this disclosure contemplates any suitable subsets of any suitable magnetometers with any suitable orientations or arrangement relative to each other to measure a distance traversed by or a speed of a e or other apparatus (such as for example a mobile telephone or other mobile device).

In particular embodiments, magnetometers 1002 sense a magnetic field and detect pulses corresponding to peaks of the corresponding magnetic values and the number of pulses corresponds to the robot or other apparatus (such as for example a mobile telephone or other mobile device) traversing a fixed distance, which may be referred to as a step (e.g. L). In particular embodiments, sensor set 1004 is associated with a microcontroller or other processor to count the number of pulses and convert them into a measure of a traversed distance (number of pulses×L) or an average speed of movement of the robot or other apparatus (such as for example a mobile telephone or other mobile device). Particular embodiments use the measurements from a pair of equivalent magnetometers 1002 (to calculate an average speed or traversed distance) fixed in the same (or opposite, e.g., rotated by 180° in a horizontal plane) orientation in front of each other (as shown in FIG. 10). Magnetometers 1002 in each pair of magnetometers 1002 are located a fixed, predetermined distance L from each other. In particular embodiments, the value of L is selected based on the technological possibility of manufacturing of magnetometers 1002 and may be from fractions of a micrometer to several meters.

Figure 11:
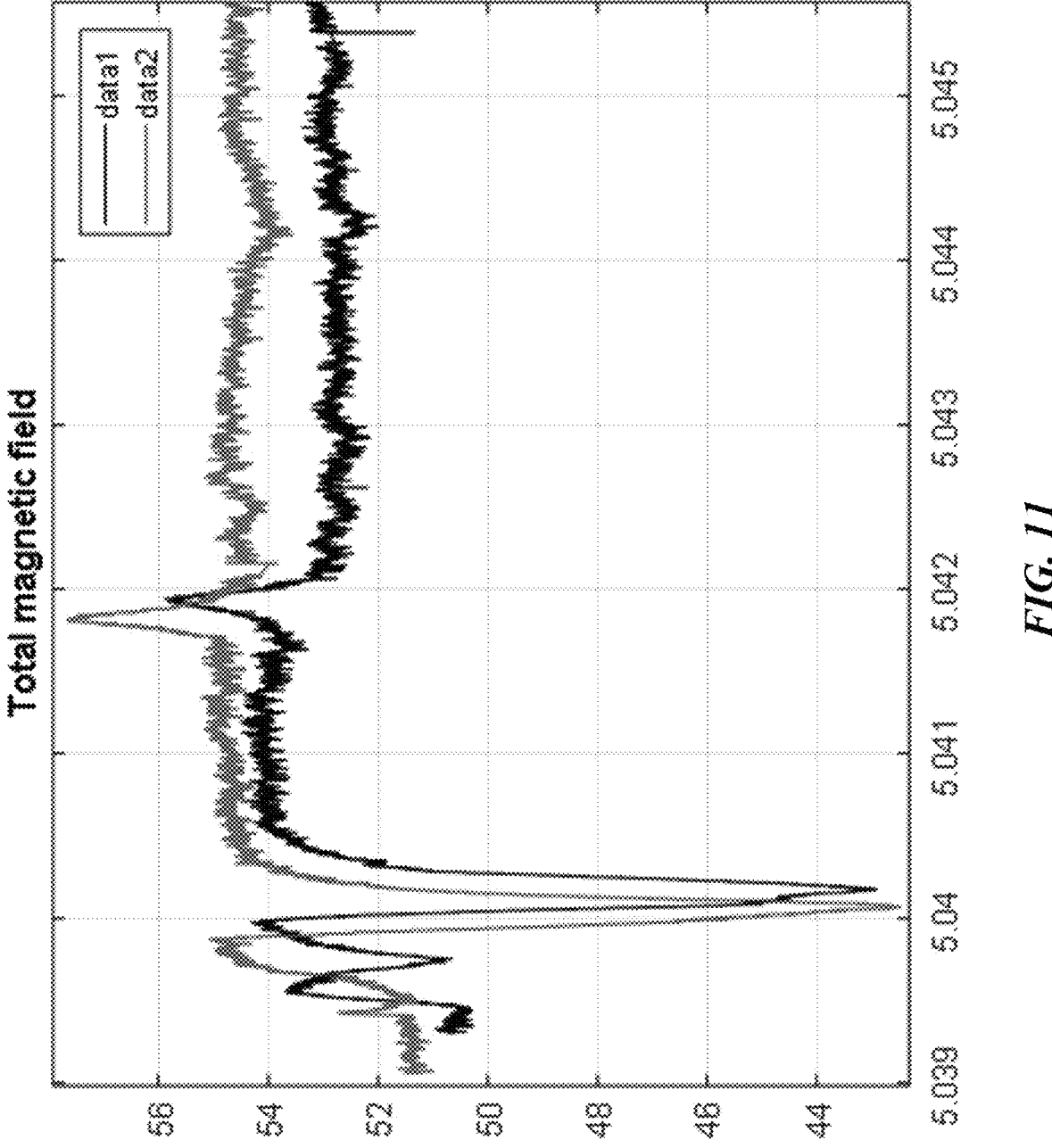
FIG. 11 illustrates example magnetic measurements by an example pair of magnetometers.

As an example and not by way of limitation, magnetometers 1002a and 1002b may be precisely positioned and have a fixed, predetermined distance L between semiconductor packages 1010a and 1010b containing the magnetic-field-sensing element(s) of magnetometers 1002a and 1002b. One or more axes of the body-fixed coordinate frames of magnetometers 1002a and 1002b substantially coincide with or are substantially parallel to each other, e.g., they have identical orientations (as shown in FIG. 10). When the robot or other apparatus (such as for example a mobile telephone or other mobile device) including magnetometers 1002a and 1002b moves in a straight line in the direction of a point Q (which is arbitrarily selected), magnetometers 1002a and 1002b pass through point Q sequentially. At any given point in space (e.g. Q) for magnetometer 1002a, the values of $B_{x1}$, $B_{y1}$, and $B_{z1}$ of the magnetic field are close to or coincide with the values of $B_{x2}$, $B_{y2}$, $B_{z2}$ for magnetometer 1002b at point Q. (FIG. 11 illustrates example magnetic measurements by an example pair of magnetometers.) When magnetometer 1002a passes point Q (q), the microcontroller processes and records the data $B_{x1q}$, $B_{y1q}$, and $B_{z1q}$ and values calculated based on them (e.g. B, D, and I). With continued movement of the robot or other apparatus (such as for example a mobile telephone or other mobile device), the microcontroller compares the current values of magnetometer 1002b ($B_{x2cur}$, $B_{y2cur}$, $B_{z2cur}$, B, D, and I) with the recorded $B_{x1q}$, $B_{y1q}$, $B_{z1q}$ (and B, D, and I). The values of $B_{x2cur}$, $B_{y2cur}$, and $B_{z2cur}$ and $B_{x1q}$, $B_{y1q}$, $B_{z1q}$, respectively, will substantially coincide when magnetometer 1002b passes through point Q.

When magnetometer 1002a passes point Q (q), the microcontroller processes and records the data $B_{x1p}$, $B_{y1p}$, and $B_{z1p}$ and the corresponding values based on them (e.g. B, D, and I). With continuous movement of the robot or other apparatus (such as for example a mobile telephone or other mobile device) including magnetometers 1002a and 1002b, the microcontroller compares the current values of magnetometer 1002b ($B_{x2cur}$, $B_{y2cur}$, $B_{z2cur}$ and corresponding calculated B, D, and I) with the recorded $B_{x1p}$, $B_{y1p}$, $B_{z1p}$ (and B, D, and I). If the values of $B_{x2cur}$, $B_{y2cur}$, and $B_{z2cur}$ and $B_{x1p}$, $B_{y1p}$, $B_{z1p}$, respectively, substantially coincide, then magnetometer 1002a has crossed point Q (q). The controller records the transition of magnetometer 1002b to point P and adds the value of L to the path already traversed. The controller may then calculate the average speed using V=L/t, with t being the time between magnetometer 1002a and magnetometer 1002b reaching point Q, which may be obtained from a clock signal in magnetometers 1002a and 1002b or in another component of sensor set 1000 or in a controller associated with sensor set 1000.

Sensor set 1000 includes n magnetometers 1002 in n/2 equivalent pairs of magnetometers 1002 located on a horizontal platform. Magnetometers 1002 in each pair are located a fixed, predetermined distance L from each other. In particular embodiments, for a first magnetometer 1002 and a second magnetometer 1002 making up a pair of magnetometers 1002, the following is true: the axes of first magnetometer 1002 and the axes of second magnetometer 1002 are equally oriented at any given point in space. (Alternatively, in particular embodiments, first and second magnetometers 1002 may be oriented relative to each other such that each of one or more axes of first magnetometer 1002 is opposite in direction from a corresponding axis of second magnetometer 1002.) The measured magnetic field values for first and second magnetometers 1002 will substantially coincide when first and second magnetometers 1002 pass through the same point in space. When first and second magnetometers 1002 pass through a given point $Q_1$ (e.g. sequentially first magnetometer 1002 and then second magnetometer 1002), the robot or other apparatus (such as for example a mobile telephone or other mobile device) including first and second magnetometers 1002 has traversed the distance L. The events when the magnetic measurements of each magnetometer in the pair coincide may be recorded by the robot or other apparatus (such as for example a mobile telephone or other mobile device) and processed by the controller. The average speed of the robot or other apparatus (such as for example a mobile telephone or other mobile device) over that distance L may be determined by V=L/t, with t being the elapsed time of movement of the robot or other apparatus (such as for example a mobile telephone or other mobile device) over that distance L (which may be obtained from a clock signal in first or second magnetometer 1002 or 1002 or in another component of sensor set 1000 or in a controller associated with sensor set 1000).

Figure 12:
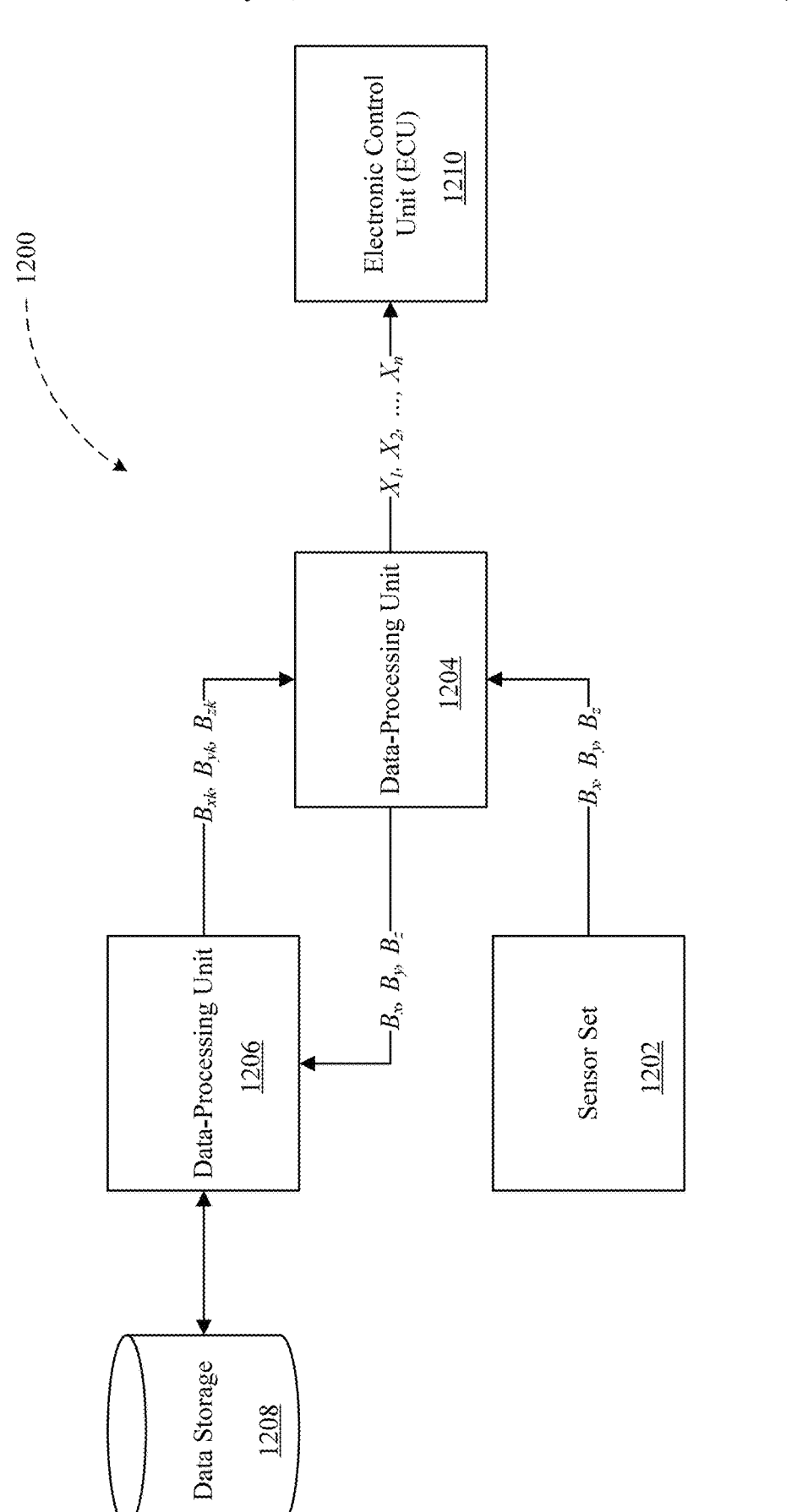
FIG. 12 illustrates an example system for controlling motion with magnetometers.

FIG. 12 illustrates an example system 1200 for controlling motion of a robot or other apparatus (such as for example a mobile telephone or other mobile device) with magnetometers. System 1200 may be used to generate a magnetic map of an area or region. In addition or as an alternative, system 1200 may be used for navigation or localization of a robot or other apparatus (such as for example a mobile telephone or other mobile device) within an area based on a magnetic map of that area that has already been generated. In addition or as an alternative, system 1200 may be used to measure a distance traversed by or a speed (e.g. an average speed) of a robot or other apparatus (such as for example a mobile telephone or other mobile device). In the example of FIG. 12, system 1200 includes a sensor set 1202, data processing units 1204 and 1206, data storage 1208, and electronic control unit (ECU) 1210. All or some of the components of system 1200 may be on board the robot or other apparatus (such as for example a mobile telephone or other mobile device) being controlled. As an example, sensor set 1202, data processing units 1204 and 1206, data storage 1208, and ECU 1210 may all be entirely on board the robot or other apparatus (such as for example a mobile telephone or other mobile device). As another example, sensor set 1202, data processing units 1204 and 1206, and ECU 1210 may all be entirely on board the robot or other apparatus (such as for example a mobile telephone or other mobile device), while one or more portions of data storage 1208 are remote from and not on board the robot or other apparatus (such as for example a mobile telephone or other mobile device) and one or more other portions of data storage 1208 are on board the robot or other apparatus (such as for example a mobile telephone or other mobile device). Although particular components of system 1200 are described and illustrated herein as having particular locations relative to the robot or other apparatus (such as for example a mobile telephone or other mobile device) being controlled, this disclosure contemplates any suitable components of system 1200 having any suitable locations relative to the robot or other apparatus (such as for example a mobile telephone or other mobile device) being controlled.

Sensor set 1202 may include a set of magnetometers organized into two or more subsets of magnetometers. For example, sensor set 1202 may include a set of magnetometers for measuring a distance traversed by or a speed (e.g. an average speed) of a robot or other apparatus (such as for example a mobile telephone or other mobile device), as described above with reference to FIG. 10. As another example, in addition or as an alternative, sensor set 1202 may include eight magnetometers arranged and oriented on a plane with a step of 45°, organized into four pairs of opposing magnetometers, as described above with reference to FIG. 9. As the robot or other apparatus (such as for example a mobile telephone or other mobile device) including system 1200 moves along a route (which may but need not be predetermined), sensor set 1202 may measure the external magnetic field at each of one or more points along the route. At each such point, each magnetometer of sensor set 1202 may determine the x, y, and z vector components of the magnetic field ($B_x$, $B_y$, and $B_z$) at that point, as measured by that magnetometer, and those values from each magnetometer may be communicated to data-processing unit 1204. Although system 1200 is described and illustrated as including a particular sensor set operating in a particular manner, this disclosure contemplates system 1200 including any suitable sensor set operating in any suitable manner.

Data-processing unit 1204 is coupled to sensor set 1202. Data-processing unit 1204 may process data from sensor set 1202. Data-processing unit 1204 may also process data from data-processing unit 1206 and communicate data to data-processing unit 1206 for storage in data storage 1208. Data-processing unit 1204 may include an ATMEGA2560 microcontroller made by MICROCHIP TECHNOLOGY mounted on an ARDUINO MEGA 2560 microcontroller board made by ARDUINO. The magnetometers in sensor set 1202 may be coupled to data-processing unit 1204 via a TCA9548A switch made by TEXAS INSTRUMENTS, which may be mounted on a board with those magnetometers. Data-processing unit 1204 may receive $B_x$, $B_y$, and $B_z$ values from each of one or more of the magnetometers in sensor-set 1202 at each of one or more points along a route (which may but need not be predetermined) as the robot or other apparatus (such as for example a mobile telephone or other mobile device) including system 1200 moves along the route. When system 1200 is being used to generate a magnetic map, data-processing unit 1204 may communicate those values from each magnetometer for each point along the route to data-processing unit 1206 for storage in data storage 1208, correlated with that point along the route and with the magnetometer that those values were received from. When system 1200 is being used for navigation or localization based on a magnetic map that has already been generated, data-processing unit 1204 may compare those values with corresponding $B_{xk}$, $B_{yk}$, and $B_{zk}$ values from data storage 1208 and, based on the results of those comparisons, generate control parameters $X_1$, $X_2$, . . . $X_n$, which are communicated to ECU 1210. For example, data $B_{xkj}$, $B_{ykj}$, and $B_{zkj}$ may be received from magnetometer k in sensor set 1202) for space point j (route on the map) via the $I^2C$ bus and enter data-processing unit 1204, where the data is translated into the desired arithmetic-logic-unit (ALU) format and sent by the (serial peripheral interface) SPI bus to data-processing unit 1206. Similarly, the data of all k magnetometers are processed and sent. Data-processing unit 1206 processes the information and writes the data to data storage 1208 in the desired format. At the end of each line, the ALU in data-processing unit 1204 adds a notification of a successful recording of magnetic-card data at a specific point by adding the value of one. As a result, a string of 24 values (for k=8) $B_{xkj}$, $B_{ykj}$ and $B_{zkj}$ (where k is the number of magnetometers) of the magnetic situation at points (j=1 in data storage 1208) in space is formed on data-processing unit 1206: $B_{x0j}$, $B_{y0j}$, $B_{z0j}$, $B_{x1j}$, $B_{y1j}$, $B_{z1j}$, $B_{x2j}$, $B_{y2j}$, $B_{z2j}$, $B_{x3j}$, $B_{y3j}$, $B_{z3j}$, $B_{x4j}$, $B_{y4j}$, $B_{z4j}$, $B_{x5j}$, $B_{y5j}$, $B_{z5j}$, $B_{x6j}$, $B_{y6j}$, $B_{z6j}$, $B_{x7j}$, $B_{y7j}$, $B_{z7j}$, 1. If data-processing unit 1204 instructs the robot or other apparatus (such as for example a mobile telephone or other mobile device) to take a step forward and sensor set 1202 transmits new magnetic-field values at point 2, then the next line entry (j=2, the second in data storage 1208) is $B_{x0j}$, $B_{y0j}$, $B_{z0j}$, $B_{x1j}$, $B_{y1j}$, $B_{z1j}$, $B_{x2j}$, $B_{y2j}$, $B_{z2j}$, $B_{x3j}$, $B_{y3j}$, $B_{z3j}$, $B_{x4j}$, $B_{y4j}$, $B_{z4j}$, $B_{x5j}$, $B_{y5j}$, $B_{z5j}$, $B_{x6j}$, $B_{y6j}$, $B_{z6j}$, $B_{x7j}$, $B_{y7j}$, $B_{z7j}$, 1 and forms a second point on the magnetic map. Step-by-step recording of the values $B_{xkj}$, $B_{ykj}$, $B_{zkj}$ creates a magnetic map of the route consisting of j points (positions). As another example, the magnetic-field state data recorded at data storage 1208 at this point is read by data-processing unit 1206 and transmitted to data-processing unit 1204. At the same time, data from sensor set 1202 transmitted to data-processing unit 1204 in the form of current values of $B_{x0curr}$, $B_{y0curr}$, $B_{z0curr}$, $B_{x1curr}$, $B_{y1curr}$, $B_{z1curr}$, $B_{x2curr}$, $B_{y2curr}$, $B_{z2curr}$, $B_{z2curr}$, $B_{x3curr}$, $B_{y3curr}$, $B_{z3curr}$, $B_{x4curr}$, $B_{y4curr}$, $B_{z4curr}$, $B_{x5curr}$, $B_{y5curr}$, $B_{z5curr}$, $B_{x6curr}$, $B_{y6curr}$, $B_{z6curr}$, $B_{x7curr}$, $B_{y7curr}$, $B_{z7curr}$, $B_{z7curr}$. In data-processing unit 1204, the data $B_{xkj}$, $B_{ykj}$, and $B_{zkj}$ are compared with the incoming real time data from magnetometers in sensor set block 1202, $B_{xkcurr}$, $B_{ykcurr}$, and $B_{zkcurr}$. The ALU in data-processing unit 1204 compares the real-time data from sensor set 1202 and then issues control commands to the actuators (motor drivers) of the robot or other apparatus (such as for example a mobile telephone or other mobile device) through ECU 1210.

Data-processing unit 1206 is also coupled to data-processing unit 1204. Data-processing unit 1206 may read or write magnetic-map data from or to data storage 1208. Data-processing unit may also include an ATMEGA2560 microcontroller made by MICROCHIP TECHNOLOGY mounted on an ARDUINO MEGA 2560 microcontroller board made by ARDUINO. Data processing units 1204 and 1206 may be physically or logically separate from each other. For example, one or more microcontrollers or other processors may function as data-processing unit 1204 and one or more other microcontrollers or other processors may function as data-processing unit 1206. Alternatively, data-processing units 1204 and 1206 may be physically or logically combined with each other in whole or in part. For example, a single microcontroller or other processor (or multiple microcontrollers or other processors operating together) may function as both data-processing units 1204 and 1206. When system 1200 is being used to generate a magnetic map, data-processing unit 1206 may receive $B_x$, $B_y$, and $B_z$ values correlated with points along a route and with magnetometers in sensor set 1202 and store that data in data storage 1208. When system 1200 is being used for navigation or localization based on a magnetic map that has already been generated, data-processing unit 1206 may read $B_{xk}$, $B_{yk}$, and $B_{zk}$ values from data storage 1208 corresponding to $B_x$, $B_y$, and $B_z$ values from sensor set 1202 and communicate those $B_{xk}$, $B_{yk}$, and $B_{zk}$ values to data-processing unit 1204. Although system 1200 is described and illustrated as including particular data-processing units operating in a particular manner, this disclosure contemplates system 1200 including any suitable data-processing units operating in any suitable manner.

Data-storage 1208 is coupled to data-processing unit 1206. Data storage 1208 may be used to store magnetic-map data and may, for example, include a micro SD module with a micro SD card. Magnetic-map data may be read from or written to the micro SD card, and the micro SD card may be removed from one robot or other apparatus (such as for example a mobile telephone or other mobile device) and installed in another robot or other apparatus (such as for example a mobile telephone or other mobile device). When system 1200 is being used to generate a magnetic map, data-processing unit 1206 may store in data storage 1208 $B_x$, $B_y$, and $B_z$ values correlated with points along a route and with magnetometers in sensor set 1202. When system 1200 is being used for navigation or localization based on a magnetic map that has already been generated, data-processing unit 1206 may read $B_{xk}$, $B_{yk}$, and $B_{zk}$ values from data storage 1208 corresponding to $B_x$, $B_y$, and $B_z$ values from sensor set 1202. Although system 1200 is described and illustrated as including particular data storage, this disclosure contemplates system 1200 including any suitable data storage.

ECU 1210 is coupled to data-processing unit 1204. ECU 1210 may be an electronic engine-control unit and may include one or more L9110 motor-control drivers. ECU 1210 may receive control parameters $X_1$, $X_2$, ... $X_n$, from data-processing unit 1204 and, based on those control parameters, generate instructions for one or more motors or other devices that cause the robot or other apparatus (such as for example a mobile telephone or other mobile device) including system 1200 to move. For example, after reading the i values of the SD line, $B_{x0i}$, $B_{y0i}$, $B_{z0i}$, $B_{x1i}$, $B_{y1i}$, $B_{z1i}$, $B_{x2i}$, $B_{y2i}$, $B_{z2i}$, $B_{y3i}$, $B_{y3i}$, $B_{z3i}$, $B_{x4i}$, $B_{y4i}$, $B_{z4i}$, $B_{x5i}$, $B_{y5i}$, $B_{z5i}$, $B_{x6i}$, $B_{y6i}$, $B_{z6i}$, $B_{x7i}$, $B_{y7i}$, $B_{z7i}$, 1, from data storage 1208 using data-processing unit 1206, data-processing unit 1204 receives read data from $B_{xk1}$, $B_{yk1}$, and $B_{zk1}$. At the same time, the current values of $B_{ycurr}$, $B_{zkcurr}$, and $B_{xkcurr}$ (in real time) are received by data-processing unit 1204. Each $B_{xk1}$, $B_{yk1}$, and $B_{zk1}$ are compared with data from the magnetometers of sensor set 1202 from $B_{xcurr}$, $B_{ykcurr}$, and $B_{zkcurr}$. The ALU of data-processing unit 1204 performs calculations according to an algorithm and then issues control commands to the actuators (motor drivers) of the robot or other apparatus (such as for example a mobile telephone or other mobile device) through ECU 1210. Although system 1200 is described and illustrated as including a particular ECU operating in a particular manner, this disclosure contemplates system 1200 including any suitable ECU operating in any suitable manner.

Although a particular system for controlling particular motion of a robot or other apparatus (such as for example a mobile telephone or other mobile device) with magnetometers, including particular components or sub-systems in a particular arrangement, is described and illustrated herein, this disclosure contemplates any suitable system for controlling any suitable motion of a robot or other apparatus (such as for example a mobile telephone or other mobile device) with magnetometers, including any suitable components or sub-systems in any suitable arrangement. For example, two or more components or sub-systems of system 1200 may be physically or logically combined with each other in whole or in part instead of being physically or logically separate from each other.

In particular embodiments, execution of the motion of the robot or other apparatus (such as for example a mobile telephone or other mobile device) along a given route within a magnetic map of an area is carried out on the basis of data received from sensor set 1202 and processed by data-processing unit 1204 according to equations (1), (2), (3), and (4) above. All given values may be calculated for each specific point i of the magnetic map of the region. Each point may correspond to some position on a map of the Earth's surface. B is the modulus of the value of the magnetic induction at a given point of the magnetic map of the region; $B_h$ is the modulus of the value of the magnetic-field strength for the x-y (horizontal) plane; $B_x$, $B_y$, and $B_z$ are the values of the magnetic induction in the body-fixed frame; D is the value of declination angle; and I is the value of inclination angle.

In particular embodiments, during the process of magnetic-map creation (during the robot or other apparatus (such as for example a mobile telephone or other mobile device)'s motion along a specified route with data recording), data-processing unit 1204 produces control parameters $X_1$, $X_2$, ... $X_n$ for ECU 1210. At the same time, data from sensor set 1202 (e.g. $B_x$, $B_y$, and $B_z$ from each $i^{th}$ point) may be communicated to and processed by data-processing unit 1204 and then recorded for each point i in data storage 1208 by data-processing unit 1206 (e.g. values of $B_{xk}$, $B_{yk}$, and $B_{zk}$, index k map). When the robot or other apparatus (such as for example a mobile telephone or other mobile device) navigates the specified route (e.g. with a piece-wise linear trajectory), the data may be read sequentially (from i=1 to i=n). For the data for point i=1, $B_{xk1}$, $B_{yk1}$, and $B_{zk1}$ are read from data storage 1208 to data-processing unit 1204 and processed by means of comparison with the actual data at point i=1 (e.g. $B_{x1}$, $B_{y1}$, and $B_{z1}$) which are continuously determined by sensor set 1202. When the data coincides, the robot or other apparatus (such as for example a mobile telephone or other mobile device) goes to the next point of the magnetic map of the region with the parameters $B_{xk2}$, $B_{yk2}$, and $B_{zk2}$. This sequence is repeated until the end of the route at point $B_{xkn}$, $B_{ykn}$, and $B_{zkn}$.

In particular embodiments, after the data of a current point of a route ($B_{xki}$, $B_{yki}$, and $B_{zki}$) is read from data storage 1208, the comparison of that data with the actual current data ($B_{xki}$, $B_{yki}$, and $B_{zki}$) is performed by data-processing unit 1204. In the case of data inequality between the reading from data storage 1208 ($B_{xki}$, $B_{yki}$, and $B_{zki}$) and the actual current values ($B_{xi}$, $B_{yi}$, and $B_{zi}$), an algorithm in data-processing unit 1204 may produce control parameters, $X_1$, $X_2$, . . . $X_n$, that provide information to ECU 1210 regarding a next maneuver by the robot or other apparatus (such as for example a mobile telephone or other mobile device) to address the inequality. After some iterations, data-processing unit 1204 may reduce and even eliminate the data inequality and achieve substantial coincidence between recorded $B_{xki}$, $B_{yki}$, and $B_{zki}$ and current values $B_{xi}$, $B_{yi}$, and $B_{zi}$ as the robot or other apparatus (such as for example a mobile telephone or other mobile device) maneuvers. After this, the robot or other apparatus (such as for example a mobile telephone or other mobile device) may start a motion-maneuver to the next route point $B_{xki+1}$, $B_{yki+1}$, and $B_{zki+1}$ read from data storage 1208.

Particular embodiments make it possible to repeat a previously recorded route in forward or reverse directions. Particular embodiments may facilitate simultaneous localization and mapping (SLAM). For example, when a robot or other apparatus (such as for example a mobile telephone or other mobile device) is repeating a previously recorded route in forward or reverse direction (which the robot or other apparatus (such as for example a mobile telephone or other mobile device) may have itself recorded or may have received from another robot or other apparatus (such as for example a mobile telephone or other mobile device) or other source), that robot or other apparatus (such as for example a mobile telephone or other mobile device) may simultaneously measure and record the magnetic field around the robot or other apparatus (such as for example a mobile telephone or other mobile device) and those measurements may be used to update or create a magnetic map of the route. In particular embodiments, when reinstalling an SD card (or other storage media) with a recorded route to another robot or other apparatus (such as for example a mobile telephone or other mobile device), that robot or other apparatus (such as for example a mobile telephone or other mobile device) can accurately repeat the specified route in forward or reverse directions. Particular embodiments are effective for use by ground and aerial vehicles, on water surface, and submarine vessels. Particular embodiments may obviate special onboard radio control or satellite navigation systems.

Figure 13:
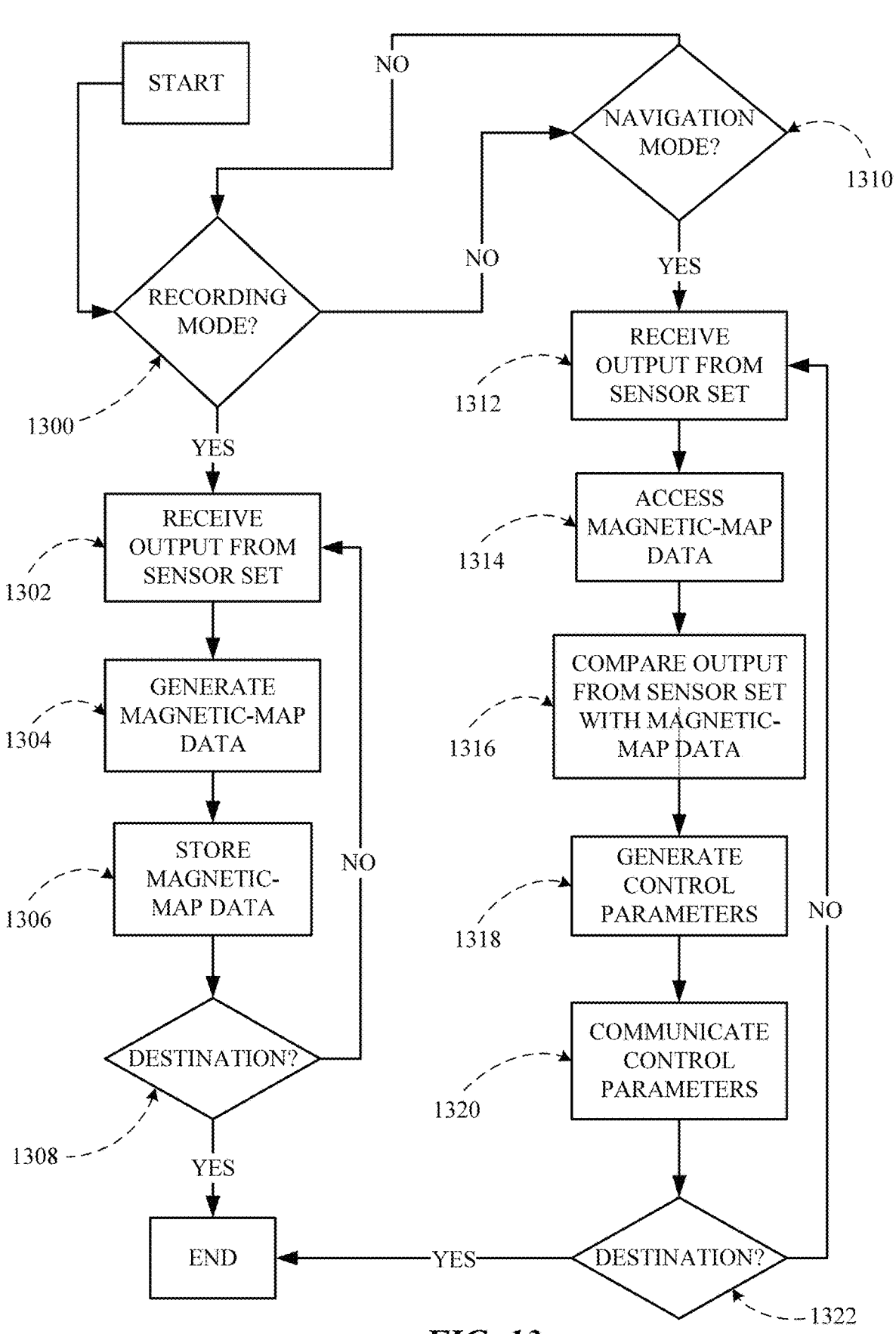
FIG. 13 illustrates an example method for controlling motion with magnetometers.

FIG. 13 illustrates an example method for controlling motion of a robot or other apparatus (such as for example a mobile telephone or other mobile device) with magnetometers. The method may begin at step 1300, where data-processing unit 1204 determines whether system 1200 is in recording mode. If system 1200 is in recording mode (e.g. the robot or other apparatus (such as for example a mobile telephone or other mobile device) including system 1200 is traversing a path or region to magnetically map the path or region), then the method proceeds to step 1302, where data-processing unit 1204 receives output from sensor set 1202. As described above, the output may include the x, y, and z vector components of an external magnetic field ($B_x$, $B_y$, and $B_z$) as measured by each magnetometer in sensor set 1202 at a point i along the path or within the region being magnetically mapped. At step 1304, data-processing unit 1204 generates magnetic-map data based on the output from sensor set 1202. The magnetic-map data may include $B_x$, $B_y$, and $B_z$ values from each magnetometer in sensor set 1202 indexed according to the point i where those values were determined, the map k they correspond to, and the magnetometer m they were generated by. At step 1306, data-processing unit 1204 communicates the magnetic-map data to data-processing unit 1206, which stores the magnetic-map data in data storage 1208. At step 1308, if the robot or other apparatus (such as for example a mobile telephone or other mobile device) including system 1200 has reached its destination (e.g. the robot or other apparatus (such as for example a mobile telephone or other mobile device) has completed traversing the path or region to be magnetically mapped), then the method may end. At step 1308, if the robot or other apparatus (such as for example a mobile telephone or other mobile device) has not reached its destination, then the method returns to step 1302, where data-processing unit 1204 receives output from sensor set 1202 at a next point i+1 along the path or within the region being magnetically mapped as the robot or other apparatus (such as for example a mobile telephone or other mobile device) traverses the path or region.

At step 1300, if system 1200 is not in recording mode, then the method proceeds to step 1310, where data-processing unit 1204 determines whether system 1200 is in navigation mode. If system 1200 is not in navigation mode, then the method returns to step 1300. If system 1200 is in navigation mode (e.g. the robot or other apparatus (such as for example a mobile telephone or other mobile device) including system 1200 is navigating a route), then the method proceeds to step 1312, where data-processing unit 1204 receives output from sensor set 1202. As described above, the output includes the x, y, and z vector components of an external magnetic field ($B_x$, $B_y$, and $B_z$) as measured by each magnetometer in sensor set 1202 at a point j along the route being navigated. At step 1314, data-processing unit 1204 accesses magnetic-map data corresponding to the output from sensor set 1202. The magnetic-map data corresponding to the output from sensor set 1202 includes $B_x$, $B_y$, and $B_z$ values corresponding to each magnetometer m in sensor set 1202 for point j as indicated by the map/of the region that the robot or other apparatus (such as for example a mobile telephone or other mobile device) is navigating in. At step 1316, data-processing unit 1204 compares the output of sensor set 1202 with the corresponding magnetic-map data. To perform this comparison, data-processing unit 1204 may compare all data for point j, $B_{xkj}$, $B_{ykj}$, and $B_{zkj}$, of the map against incoming values from sensor set 1202, $B_{xkcurr}$, $B_{ykcurr}$, and $B_{zkcurr}$ in real time. The ALU of data-processing unit 1204 compares the data and issues control commands to the actuators (motor drivers) of the robot or other apparatus (such as for example a mobile telephone or other mobile device). At step 1318, data-processing unit 1204 generates one or more control parameters based on the comparison at step 1316. As described above, the control parameters may include instructions or other information regarding a next maneuver to be made by the robot or other apparatus (such as for example a mobile telephone or other mobile device) including system 1200. If the comparison at step 1316 indicates there is a material inequality between measurement of the external magnetic field at point j and the corresponding magnetic-map data, then the maneuver may attempt to put the robot or other apparatus (such as for example a mobile telephone or other mobile device) on the route being navigated to correct or otherwise address the inequality. If the comparison at step 1316 indicates there is not a material inequality between measurement of the external magnetic field at point j and the corresponding magnetic-map data, then the maneuver may attempt to take the robot or other apparatus (such as for example a mobile telephone or other mobile device) including system 1200 to a next point j+1 along the route being navigated. At step 1320, data-processing unit 1204 communicates the control parameters to ECU 1210, which may cause the robot or other apparatus (such as for example a mobile telephone or other mobile device) to execute one or more maneuvers based on the control parameters. For example, in data-processing unit 1204, the command is generated to perform a step from point j=9. From data storage 1208, a map data string for point j=9 is passed (via data-processing unit 1206) to data-processing unit 1204. The data for j=9 is read from the ninth row of the SD card, $B_{x0j}$, $B_{y0j}$, $B_{z0j}$, $B_{x1j}$, $B_{y1j}$, $B_{z1j}$, $B_{x2j}$, $B_{y2j}$, $B_{z2j}$, $B_{x3j}$, $B_{y3j}$, $B_{z3j}$, $B_{x4j}$, $B_{y4j}$, $B_{z4j}$, $B_{x5j}$, $B_{y5j}$, $B_{z5j}$, $B_{x6j}$, $B_{y6j}$, $B_{z6j}$, $B_{x7j}$, $B_{y7j}$, $B_{z7j}$, 1 (hereinafter $B_{xkj}$, $B_{ykj}$, $B_{zkj}$). In data-processing unit 1204, the data of $B_{xkj}$, $B_{ykj}$, and $B_{zkj}$ for point j=9 is compared with real-time data from sensor set 1202 in the form of current values of $B_{x0curr}$, $B_{y0curr}$, $B_{z0curr}$, $B_{x1curr}$, $B_{y1curr}$, $B_{z1curr}$, $B_{x2curr}$, $B_{y2curr}$, $B_{z2curr}$, $B_{x3curr}$, $B_{y3curr}$, $B_{z3curr}$, $B_{x4curr}$, $B_{y4curr}$, $B_{z4curr}$, $B_{x5curr}$, $B_{y5curr}$, $B_{z5curr}$, $B_{x6curr}$, $B_{z6curr}$, $B_{z6curr}$, $B_{z6curr}$, $B_{x7curr}$, $B_{y7curr}$, and $B_{z7curr}$. The ALU of data-processing unit 1204 makes a comparison and issues a control command, for example, rotating one degree clockwise around the sensor axis (of eight magnetometers). Then data-processing unit 1204 receives from sensor set 1202 new data $B_{ykcurr}$, and $B_{zkcurr}$. The ALU of data-processing unit 1204 compares them with the values of $B_{xkj}$, $B_{ykj}$, and $B_{zkj}$ from the map. Then data-processing unit 1204 issues another control command, e.g., a rotation of one degree clockwise around the axis. The process continues according to the given algorithm until the material inequality between the measurement of the external magnetic field at point j and the corresponding magnetic-card data is eliminated. After that, the robot or other apparatus (such as for example a mobile telephone or other mobile device) takes a step from point j in a given direction. Data-processing unit 1204 generates the execution of the next step from the point j=j+1 (i.e. point j=10). At step 1322, if the robot or other apparatus (such as for example a mobile telephone or other mobile device) including system 1200 has reached its destination (e.g. the robot or other apparatus (such as for example a mobile telephone or other mobile device) has completed traversing the route to be navigated), then the method may end.

Particular embodiments may repeat one or more steps of the method of FIG. 13, where appropriate. Although this disclosure describes and illustrates particular steps of the method of FIG. 13 as occurring in a particular order, this disclosure contemplates any suitable steps of the method of FIG. 13 occurring in any suitable order. Moreover, although this disclosure describes and illustrates an example method for controlling motion of a robot or other apparatus (such as for example a mobile telephone or other mobile device) with magnetometers including the particular steps of the method of FIG. 13, this disclosure contemplates any suitable method for controlling motion of a robot or other apparatus (such as for example a mobile telephone or other mobile device) with magnetometers including any suitable steps, which may include all, some, or none of the steps of the method of FIG. 13, where appropriate. Furthermore, although this disclosure describes and illustrates particular components, devices, or systems carrying out particular steps of the method of FIG. 13, this disclosure contemplates any suitable combination of any suitable components, devices, or systems carrying out any suitable steps of the method of FIG. 13.

Figure 14:
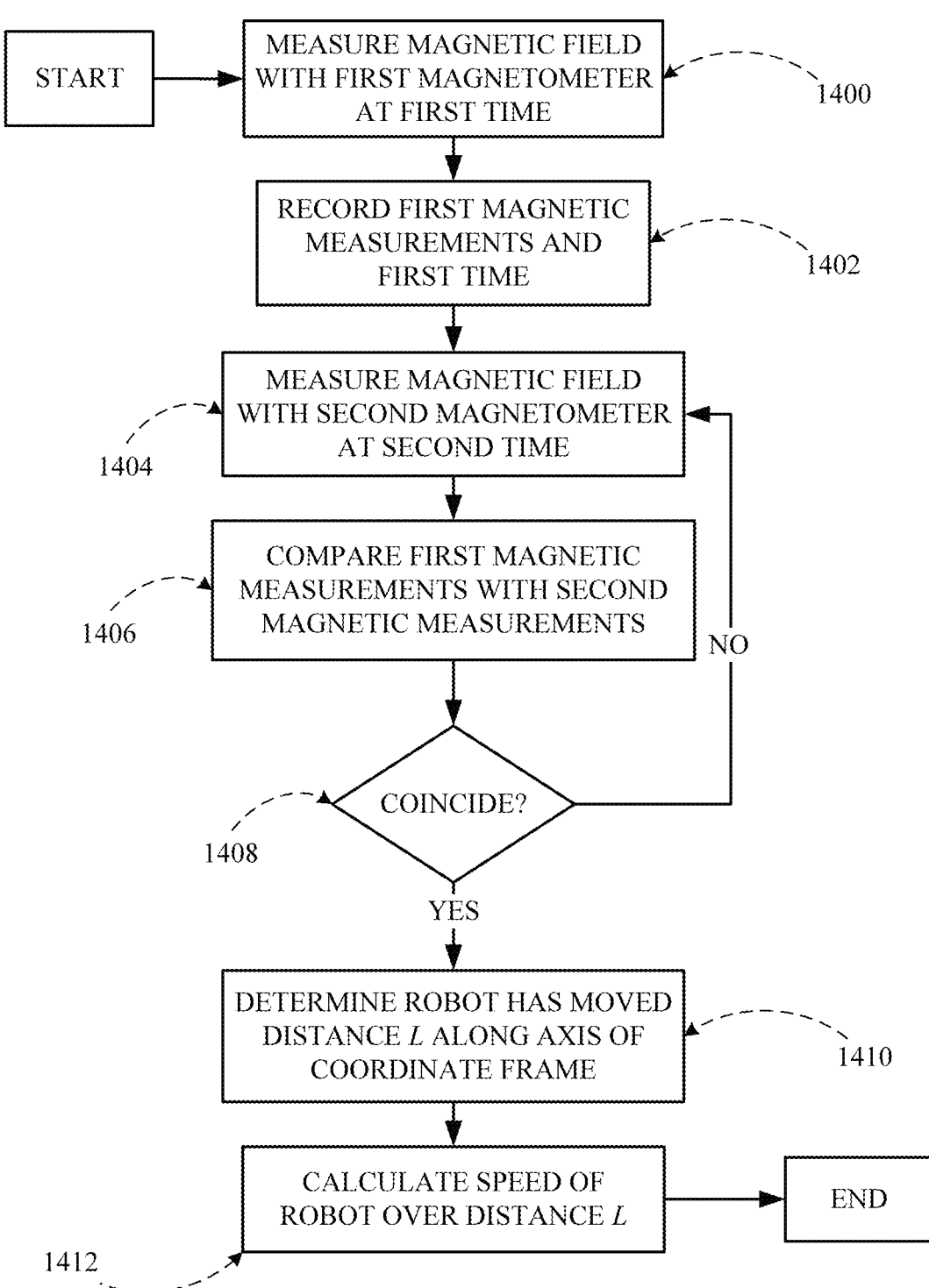
FIG. 14 illustrates an example method for measuring a distance traversed or a speed.

FIG. 14 illustrates an example method for measuring a distance traversed by or a speed of a robot or other apparatus (such as for example a mobile telephone or other mobile device). The method may begin at step 1400, where system 1200 measures a magnetic field with a first magnetometer of a pair of magnetometers in sensor set 1202. The first and second magnetometers are located a fixed, predetermined distance L from each other. The first magnetometer has a first body-fixed coordinate frame, and the second magnetometer has a second body-fixed coordinate frame. Each of one or more axes of the first body-fixed coordinate frame coincide with or are parallel to a corresponding axis of the second body-fixed coordinate frame at any given point in space. The method then proceeds to step 1402, where system 1200 records the magnetic measurements made at step 1402 along with an indication of a time when those magnetic measurements were made. The method then proceeds to step 1404, where system 1200 measures the magnetic field with the second magnetometer as the robot or other apparatus (such as for example a mobile telephone or other mobile device) including system 1200 moves. The method then proceeds to step 1406, where system 1200 compares the magnetic measurements made at step 1402 with the magnetic measurements made at step 1404. At step 1408, if the magnetic measurements made at step 1402 do not substantially coincide with the magnetic measurements made at step 1404, then the method returns to step 1404. At step 1408, if the magnetic measurements made at step 1402 substantially coincide with the magnetic measurements made at step 1404, then the method proceeds to step 1410, where, based on the substantial coincidence, system 1200 determines that the robot or other apparatus (such as for example a mobile telephone or other mobile device) including system 1200 has traversed distance L. The method then proceeds to step 1412, where system 1200 calculates the average speed of that traversal using V=L/t, with t being the time between the magnetic measurements at step 1404 and the magnetic measurements at step 1402, at which point the method may end.

Particular embodiments may repeat one or more steps of the method of FIG. 14, where appropriate. Although this disclosure describes and illustrates particular steps of the method of FIG. 14 as occurring in a particular order, this disclosure contemplates any suitable steps of the method of FIG. 14 occurring in any suitable order. Moreover, although this disclosure describes and illustrates an example method for controlling motion of a robot or other apparatus (such as for example a mobile telephone or other mobile device) with magnetometers including the particular steps of the method of FIG. 14, this disclosure contemplates any suitable method for controlling motion of a robot or other apparatus (such as for example a mobile telephone or other mobile device) with magnetometers including any suitable steps, which may include all, some, or none of the steps of the method of FIG. 14, where appropriate. Furthermore, although this disclosure describes and illustrates particular components, devices, or systems carrying out particular steps of the method of FIG. 14, this disclosure contemplates any suitable combination of any suitable components, devices, or systems carrying out any suitable steps of the method of FIG. 14.

Figure 15:
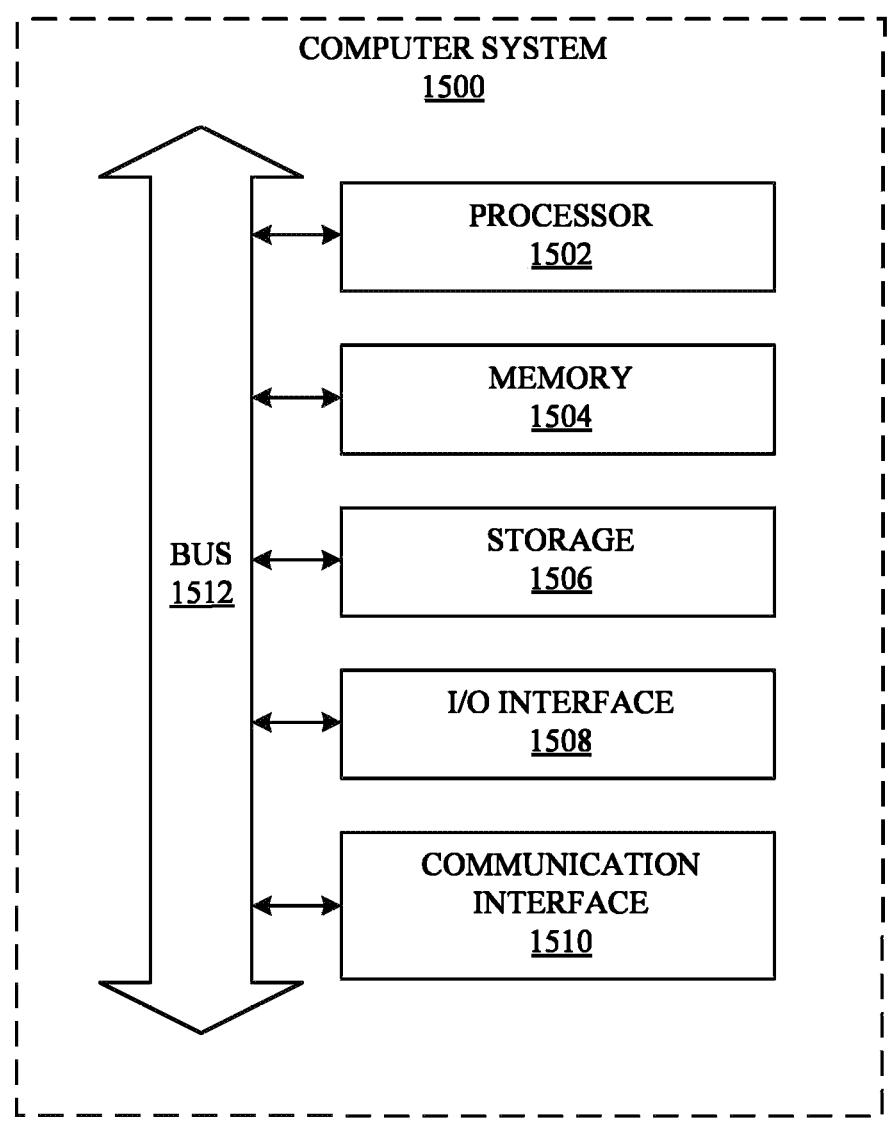
FIG. 15 illustrates an example computer system.

FIG. 15 illustrates an example computer system 1500. In particular embodiments, one or more computer systems 1500 perform one or more steps of one or more methods described or illustrated herein. In particular embodiments, one or more computer systems 1500 provide functionality described or illustrated herein. In particular embodiments, software running on one or more computer systems 1500 performs one or more steps of one or more methods described or illustrated herein or provides functionality described or illustrated herein. Particular embodiments include one or more portions of one or more computer systems 1500. Herein, reference to a computer system may encompass a computing device, and vice versa, where appropriate. Moreover, reference to a computer system may encompass one or more computer systems, where appropriate.

This disclosure contemplates any suitable number of computer systems 1500. This disclosure contemplates computer system 1500 taking any suitable physical form. As example and not by way of limitation, computer system 1500 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, computer system 1500 may include one or more computer systems 1500; be unitary or distributed; span multiple locations; span multiple machines; span multiple data centers; or reside in a cloud, which may include one or more cloud components in one or more networks. Where appropriate, one or more computer systems 1500 may perform without substantial spatial or temporal limitation one or more steps of one or more methods described or illustrated herein. As an example and not by way of limitation, one or more computer systems 1500 may perform in real time or in batch mode one or more steps of one or more methods described or illustrated herein. One or more computer systems 1500 may perform at different times or at different locations one or more steps of one or more methods described or illustrated herein, where appropriate.

In particular embodiments, computer system 1500 includes a processor 1502, memory 1504, storage 1506, an input/output (I/O) interface 1508, a communication interface 1510, and a bus 1512. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1502 includes hardware for executing instructions, such as those making up a computer program. As an example and not by way of limitation, to execute instructions, processor 1502 may retrieve (or fetch) the instructions from an internal register, an internal cache, memory 1504, or storage 1506; decode and execute them; and then write one or more results to an internal register, an internal cache, memory 1504, or storage 1506. In particular embodiments, processor 1502 may include one or more internal caches for data, instructions, or addresses. This disclosure contemplates processor 1502 including any suitable number of any suitable internal caches, where appropriate. As an example and not by way of limitation, processor 1502 may include one or more instruction caches, one or more data caches, and one or more translation lookaside buffers (TLBs). Instructions in the instruction caches may be copies of instructions in memory 1504 or storage 1506, and the instruction caches may speed up retrieval of those instructions by processor 1502. Data in the data caches may be copies of data in memory 1504 or storage 1506 for instructions executing at processor 1502 to operate on; the results of previous instructions executed at processor 1502 for access by subsequent instructions executing at processor 1502 or for writing to memory 1504 or storage 1506; or other suitable data. The data caches may speed up read or write operations by processor 1502. The TLBs may speed up virtual-address translation for processor 1502. In particular embodiments, processor 1502 may include one or more internal registers for data, instructions, or addresses. This disclosure contemplates processor 1502 including any suitable number of any suitable internal registers, where appropriate. Where appropriate, processor 1502 may include one or more ALUs; be a multi-core processor; or include one or more processors 1502. Although this disclosure describes and illustrates a particular processor, this disclosure contemplates any suitable processor.

In particular embodiments, memory 1504 includes main memory for storing instructions for processor 1502 to execute or data for processor 1502 to operate on. As an example and not by way of limitation, computer system 1500 may load instructions from storage 1506 or another source (such as, for example, another computer system 1500) to memory 1504. Processor 1502 may then load the instructions from memory 1504 to an internal register or internal cache. To execute the instructions, processor 1502 may retrieve the instructions from the internal register or internal cache and decode them. During or after execution of the instructions, processor 1502 may write one or more results (which may be intermediate or final results) to the internal register or internal cache. Processor 1502 may then write one or more of those results to memory 1504. In particular embodiments, processor 1502 executes only instructions in one or more internal registers or internal caches or in memory 1504 (as opposed to storage 1506 or elsewhere) and operates only on data in one or more internal registers or internal caches or in memory 1504 (as opposed to storage 1506 or elsewhere). One or more memory buses (which may each include an address bus and a data bus) may couple processor 1502 to memory 1504. Bus 1512 may include one or more memory buses, as described below. In particular embodiments, one or more memory management units (MMUs) reside between processor 1502 and memory 1504 and facilitate accesses to memory 1504 requested by processor 1502. In particular embodiments, memory 1504 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1504 may include one or more memories 1504, where appropriate. Although this disclosure describes and illustrates particular memory, this disclosure contemplates any suitable memory.

In particular embodiments, storage 1506 includes mass storage for data or instructions. As an example and not by way of limitation, storage 1506 may include a hard disk drive (HDD), a floppy disk drive, flash memory, an optical disc, a magneto-optical disc, magnetic tape, or a Universal Serial Bus (USB) drive or a combination of two or more of these. Storage 1506 may include removable or non-removable (or fixed) media, where appropriate. Storage 1506 may be internal or external to computer system 1500, where appropriate. In particular embodiments, storage 1506 is non-volatile, solid-state memory. In particular embodiments, storage 1506 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1506 taking any suitable physical form. Storage 1506 may include one or more storage control units facilitating communication between processor 1502 and storage 1506, where appropriate. Where appropriate, storage 1506 may include one or more storages 1506. Although this disclosure describes and illustrates particular storage, this disclosure contemplates any suitable storage.

In particular embodiments, I/O interface 1508 includes hardware, software, or both, providing one or more interfaces for communication between computer system 1500 and one or more I/O devices. Computer system 1500 may include one or more of these I/O devices, where appropriate. One or more of these I/O devices may enable communication between a person and computer system 1500. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1508 for them. Where appropriate, I/O interface 1508 may include one or more device or software drivers enabling processor 1502 to drive one or more of these I/O devices. I/O interface 1508 may include one or more I/O interfaces 1508, where appropriate. Although this disclosure describes and illustrates a particular I/O interface, this disclosure contemplates any suitable I/O interface.

In particular embodiments, communication interface 1510 includes hardware, software, or both providing one or more interfaces for communication (such as, for example, packet-based communication) between computer system 1500 and one or more other computer systems 1500 or one or more networks. As an example and not by way of limitation, communication interface 1510 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1510 for it. As an example and not by way of limitation, computer system 1500 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1500 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1500 may include any suitable communication interface 1510 for any of these networks, where appropriate. Communication interface 1510 may include one or more communication interfaces 1510, where appropriate. Although this disclosure describes and illustrates a particular communication interface, this disclosure contemplates any suitable communication interface.

In particular embodiments, bus 1512 includes hardware, software, or both coupling components of computer system 1500 to each other. As an example and not by way of limitation, bus 1512 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1512 may include one or more buses 1512, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. The embodiments disclosed herein are only examples, and the scope of this disclosure is not limited to them. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Particular embodiments may include all, some, or none of the components, elements, features, functions, operations, or steps of the embodiments disclosed herein. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

The invention claimed is:

1. An apparatus comprising:

a first magnetometer operable to measure a magnetic field, wherein the first magnetometer comprises a first coordinate frame that comprises a first x axis, a first y axis, and a first z axis;

a second magnetometer operable to measure the magnetic field, wherein:

the second magnetometer comprises a second coordinate frame that comprises a second x axis, a second y axis, and a second z axis; and each of one or more of the second x axis, the second y axis, or the second z axis has a predetermined orientation relative to the first x axis, the first y axis, or the first z axis;

a third magnetometer operable to measure the magnetic field, wherein the third magnetometer comprises a third coordinate frame that comprises a third x axis, a third y axis, and a third z axis; and a fourth magnetometer operable to measure the magnetic field, wherein:

the fourth magnetometer comprises a fourth coordinate frame that comprises a fourth x axis, a fourth y axis, and a fourth z axis; and each of one or more of the fourth x axis, the fourth y axis, or the fourth z axis has a predetermined orientation relative to the third x axis, the third y axis, or the third z axis.

2. The apparatus of claim 1, wherein each of one or more of the orientations is predetermined by being measured.

3. The apparatus of claim 1, wherein:

each of one or more of the second x axis, the second y axis, or the second z axis is approximately 180° or 0° from the first x axis, the first y axis, or the first z axis; and each of one or more of the fourth x axis, the fourth y axis, or the fourth z axis is approximately 180° or 0° from the third x axis, the third y axis, or the third z axis.

4. The apparatus of claim 1, wherein:

the second x axis is approximately 180° from the first x axis;

the second y axis is approximately 180° from the first y axis;

the second z axis is approximately 0° from the first z axis;

the fourth x axis is approximately 180° from the third x axis;

the fourth y axis is approximately 180° from the third y axis; and the fourth z axis is approximately 0° from the third z axis.

5. The apparatus of claim 1, wherein:

the second magnetometer is positioned and oriented relative to the first magnetometer such that each of one or more of the second x axis, the second y axis, or the second z axis is approximately 180° from the first x axis, the first y axis, or the first z axis, respectively; and the fourth magnetometer is positioned and oriented relative to the third magnetometer such that each of one or more of the fourth x axis, the fourth y axis, or the fourth z axis is 180° from the third x axis, the third y axis, or the third z axis, respectively.

6. The apparatus of claim 1, wherein:

the second magnetometer is positioned relative to the first magnetometer such that measurement of the magnetic field by the second magnetometer along each of one or more of the second x axis, the second y axis, or the second z axis is approximately equal to measurement of the magnetic field by the first magnetometer along each of one or more of the first x axis, the first y axis, or the first z axis, respectively; and the fourth magnetometer is positioned relative to the third magnetometer such that measurement of the magnetic field by the fourth magnetometer along each of one or more of the fourth x axis, the fourth y axis, or the fourth z axis is approximately equal to measurement of the magnetic field by the third magnetometer along each of one or more of the third x axis, the third y axis, or the third z axis, respectively.

7. The apparatus of claim 1, wherein the first, second, third, and fourth magnetometers are arranged on a plane.

8. The apparatus of claim 7, wherein:

the first and second magnetometers are positioned along a first line on the plane; and the third and fourth magnetometers are positioned along a second line on the plane that is approximately perpendicular to the first line.

9. The apparatus of claim 8, further comprising:

a fifth magnetometer arranged on the plane and positioned along a third line on the plane and operable to measure the magnetic field, wherein the fifth magnetometer comprises a fifth coordinate frame that comprises a fifth x axis, a fifth y axis, and a fifth z axis;

a sixth magnetometer arranged on the plane and positioned along a third line on the plane and operable to measure the magnetic field, wherein:

the sixth magnetometer comprises a sixth coordinate frame that comprises a sixth x axis, a sixth y axis, and a sixth z axis; and each of one or more of the sixth x axis, the sixth y axis, or the sixth z axis has a predetermined orientation relative to the fifth x axis, the fifth y axis, or the fifth z axis;

a seventh magnetometer arranged on the plane and positioned along a fourth line on the plane and operable to measure the magnetic field, wherein the seventh magnetometer comprises a seventh coordinate frame that comprises a seventh x axis, a seventh y axis, and a seventh z axis; and an eighth magnetometer arranged on the plane and positioned along a fourth line on the plane and operable to measure the magnetic field, wherein:

the eighth magnetometer comprises an eighth coordinate frame that comprises an eighth x axis, an eighth y axis, and an eighth z axis; and each of one or more of the eighth x axis, the eighth y axis, or the eighth z axis has a predetermined orientation relative to the seventh x axis, the seventh y axis, or the seventh z axis;

wherein:

the third line is approximately perpendicular to the fourth line; and there is an approximately 45° angle between first line and the third line.

10. The apparatus of claim 1, wherein:

the first magnetometer is arranged on a first facet of a three-dimensional shape; and the third magnetometer is arranged on a second facet of the three-dimensional shape.

11. The apparatus of claim 10, wherein:

the second magnetometer is arranged on the first facet of the three-dimensional shape; and the fourth magnetometer is arranged on the third facet of the three-dimensional shape.

12. The apparatus of claim 10, wherein:

the second magnetometer is arranged on a third facet of the three-dimensional shape; and the fourth magnetometer is arranged on a fourth facet of the three-dimensional shape.

13. The apparatus of claim 1, further comprising a device that is operable to navigate or localize using the first, second, third, and fourth magnetometers.

14. The apparatus of claim 1, further comprising a device that is operable to generate one or more portions of a magnetic map of an area using the first, second, third, and fourth magnetometers.

15. A method comprising:

receiving output from a sensor set comprising:

a first magnetometer operable to measure a magnetic field, wherein the first magnetometer comprises a first coordinate frame that comprises a first x axis, a first y axis, and a first z axis;

a second magnetometer operable to measure the magnetic field, wherein:

the second magnetometer comprises a second coordinate frame that comprises a second x axis, a second y axis, and a second z axis; and each of one or more of the second x axis, the second y axis, or the second z axis has a predetermined orientation relative to the first x axis, the first y axis, or the first z axis;

a third magnetometer operable to measure the magnetic field, wherein the third magnetometer comprises a third coordinate frame that comprises a third x axis, a third y axis, and a third z axis; and a fourth magnetometer operable to measure the magnetic field, wherein:

the fourth magnetometer comprises a fourth coordinate frame that comprises a fourth x axis, a fourth y axis, and a fourth z axis; and each of one or more of the fourth x axis, the fourth y axis, or the fourth z axis has a predetermined orientation relative to the third x axis, the third y axis, or the third z axis; and navigating or determining a position of a device based at least in part on the output of the sensor set.

16. The method of claim 15, wherein each of one or more of the orientations is predetermined by being measured.

17. The method of claim 15, wherein:

each of one or more of the second x axis, the second y axis, or the second z axis is approximately 180° or 0° from the first x axis, the first y axis, or the first z axis; and each of one or more of the fourth x axis, the fourth y axis, or the fourth z axis is approximately 180° or 0° from the third x axis, the third y axis, or the third z axis.

18. The method of claim 15, wherein:

the second x axis is approximately 180° from the first x axis;

the second y axis is approximately 180° from the first y axis;

the second z axis is approximately 0° from the first z axis;

the fourth x axis is approximately 180° from the third x axis;

the fourth y axis is approximately 180° from the third y axis; and the fourth z axis is approximately 0° from the third z axis.

19. The method of claim 15, wherein the first, second, third, and fourth magnetometers are arranged on a plane.

20. The method of claim 15, wherein the first magnetometer is arranged on a first facet of a three-dimensional shape; and the third magnetometer is arranged on a second facet of the three-dimensional shape.

21. The method of claim 20, wherein the second magnetometer is arranged on the first facet of the three-dimensional shape; and the fourth magnetometer is arranged on the third facet of the three-dimensional shape.

22. The method of claim 20, wherein the second magnetometer is arranged on a third facet of the three-dimensional shape; and the fourth magnetometer is arranged on a fourth facet of the three-dimensional shape.

23. A method comprising:

receiving output from a sensor set comprising:

a first magnetometer operable to measure a magnetic field, wherein the first magnetometer comprises a first coordinate frame that comprises a first x axis, a first y axis, and a first z axis;

a second magnetometer operable to measure the magnetic field, wherein:

the second magnetometer comprises a second coordinate frame that comprises a second x axis, a second y axis, and a second z axis; and each of one or more of the second x axis, the second y axis, or the second z axis has a predetermined orientation relative to the first x axis, the first y axis, or the first z axis;

a third magnetometer operable to measure the magnetic field, wherein the third magnetometer comprises a third coordinate frame that comprises a third x axis, a third y axis, and a third z axis; and a fourth magnetometer operable to measure the magnetic field, wherein:

the fourth magnetometer comprises a fourth coordinate frame that comprises a fourth x axis, a fourth y axis, and a fourth z axis; and each of one or more of the fourth x axis, the fourth y axis, or the fourth z axis has a predetermined orientation relative to the third x axis, the third y axis, or the third z axis, respectively; and generating one or more portions of a magnetic map based at least in part on the output of the sensor set.

24. The method of claim 23, wherein each of one or more of the orientations is predetermined by being measured.

25. The method of claim 23, wherein:

each of one or more of the second x axis, the second y axis, or the second z axis is approximately 180° or 0° from the first x axis, the first y axis, or the first z axis; and each of one or more of the fourth x axis, the fourth y axis, or the fourth z axis is approximately 180° or 0° from the third x axis, the third y axis, or the third z axis.

26. The method of claim 23, wherein:

the second x axis is approximately 180° from the first x axis;

the second y axis is approximately 180° from the first y axis;

the second z axis is approximately 0° from the first z axis;

the fourth x axis is approximately 180° from the third x axis;

the fourth y axis is approximately 180° from the third y axis; and the fourth z axis is approximately 0° from the third z axis.

27. The method of claim 23, wherein the first, second, third, and fourth magnetometers are arranged on a plane.

28. The method of claim 23, wherein the first magnetometer is arranged on a first facet of a three-dimensional shape; and the third magnetometer is arranged on a second facet of the three-dimensional shape.

29. The method of claim 28, wherein the second magnetometer is arranged on the first facet of the three-dimensional shape; and the fourth magnetometer is arranged on the third facet of the three-dimensional shape.

\* \* \* \* \*